(12) United States Patent
Takazakura et al.

(10) Patent No.: US 10,105,836 B2
(45) Date of Patent: Oct. 23, 2018

(54) PROCESSING APPARATUS

(71) Applicants: MIE ELECTRONICS CO., LTD., Ise-shi, Mie (JP); TONGTAI MACHINE & TOOL CO., LTD., Kaohsiung (TW)

(72) Inventors: Shuhei Takazakura, Otsu (JP); Toshikazu Mukai, Tsu (JP); Noboru Okuyama, Ise (JP); Jui-Hsiung Yen, Tainan (TW); Hsin-Pao Chen, Kaohsiung (TW)

(73) Assignees: MIE ELECTRONICS CO., LTD., Ise (JP); TONGTAI MACHINE & TOOL CO., LTD., Kaohsiung (TW)

( * ) Notice: Subject to any disclaimer, the term of this patent is extended or adjusted under 35 U.S.C. 154(b) by 602 days.

(21) Appl. No.: 14/760,304

(22) PCT Filed: Jan. 16, 2013

(86) PCT No.: PCT/JP2013/000172
§ 371 (c)(1),
(2) Date: Jul. 10, 2015

(87) PCT Pub. No.: WO2014/111973
PCT Pub. Date: Jul. 24, 2014

(65) Prior Publication Data
US 2015/0352713 A1 Dec. 10, 2015

(51) Int. Cl.
B23B 37/00 (2006.01)
B25H 5/00 (2006.01)
(Continued)

(52) U.S. Cl.
CPC ............... *B25H 5/00* (2013.01); *B23B 37/00* (2013.01); *B23Q 1/0027* (2013.01); *B24B 1/04* (2013.01);
(Continued)

(58) Field of Classification Search
CPC .. B23B 37/00; B23B 2260/108; B23B 29/125
(Continued)

(56) References Cited

U.S. PATENT DOCUMENTS

| 6,288,475 B1 | 9/2001 | Ito et al. |
| 8,240,396 B2 | 8/2012 | Sauer |
| 2003/0001456 A1 | 1/2003 | Kauf et al. |

FOREIGN PATENT DOCUMENTS

| DE | 10 2011 077 568 A1 | 12/2012 |
| JP | H11-313491 A | 11/1999 |

(Continued)

OTHER PUBLICATIONS

Mar. 19, 2013 International Search Report issued in International Application No. PCT/JP2013/000172.
(Continued)

*Primary Examiner* — J. San Martin
(74) *Attorney, Agent, or Firm* — Oliff PLC

(57) ABSTRACT

A processing apparatus with a novel structure where a tool side rotates in relation to a main body side, capable of producing excellent quality transmission of an electrical signal from the tool side to the main body side with a simpler and more compact composition, and capable of driving an ultrasonic transducer provided on the tool side more effectively. A pair of signal coils are disposed between the main body side and the tool side so as to be able to transmit an electrical signal, and a power supply frequency to the ultrasonic transducer provided to the tool side is controlled by a power supply control member. At least one of the signal coils is provided with a coil winding path that reduces noise electromotive force generated due to an effect from power coils provided to the main body side and the tool side.

7 Claims, 24 Drawing Sheets

(51) Int. Cl.
*H01L 41/083* (2006.01)
*B24B 1/04* (2006.01)
*B23Q 1/00* (2006.01)

(52) U.S. Cl.
CPC ...... *H01L 41/083* (2013.01); *B23B 2260/108* (2013.01)

(58) Field of Classification Search
USPC .................................................. 310/323.18
See application file for complete search history.

(56) References Cited

FOREIGN PATENT DOCUMENTS

| | | |
|---|---|---|
| JP | H11-354348 A | 12/1999 |
| JP | 2002-028808 A | 1/2002 |
| JP | 2008-504138 A | 2/2008 |
| JP | 2011-160501 A | 8/2011 |
| WO | 2008/156116 A1 | 12/2008 |
| WO | 2009/101987 A1 | 8/2009 |

OTHER PUBLICATIONS

Aug. 17, 2016 Extended Search Report issued in European Patent Application No. 13871925.7.

PROCESSING APPARATUS

TECHNICAL FIELD

The present invention relates to a processing apparatus in which the tool side, where the tool is installed, rotates in respect to the main body side, and relates especially to a processing apparatus in which an ultrasonic transducer is equipped on the tool side and the vibration of the ultrasonic transducer is superimposed on the rotation of the tool.

BACKGROUND ART

Conventionally, for example as stated in Japanese Unexamined Patent Publication No. JP-A-2002-28808 (Patent Document 1) and PCT Japanese Translation Patent Publication No. JP-A-2008-504138 (Patent Document 2) and the like, the processing accuracy of a processing apparatus for cutting, grinding and so on is improved by providing the tool side with an ultrasonic transducer whose rotation is enabled in relation to the main body side, and superimposing, on the tool, that rotational action with the vibration of the ultrasonic transducer. With such processing apparatus, in order to supply drive power to the ultrasonic transducer that rotates in relation to the main body side, a primary power coil and a secondary power coil are arranged in opposition to the rotating parts on the main body side and the tool side, and power is supplied to the tool side from the main body side through utilization of the mutual induction action of these power coils.

Incidentally, an ultrasonic transducer is known to be considered as being equivalent to an electrical circuit that has a resonant frequency. In order to drive the ultrasonic transducer efficiently, drive power is supplied with a resonant frequency or a frequency in that neighborhood. However, in the processing apparatus, the ultrasonic transducer's resonant frequency changes along with changes in temperature in the surroundings of the ultrasonic transducer, changes in temperature in the ultrasonic transducer itself, and changes in the load applied to the tool, etc. Therefore, it was possible that the ultrasonic transducer might not be driven efficiently solely by supplying drive power at a fixed frequency, and there was a possibility of a drop in processing accuracy.

Here, it may be proposed that the tool side is provided with a detection member for detecting the state of vibration of the ultrasonic transducer, and a signal coil is provided on both the main body side and the tool side. By utilizing the mutual induction action of those signal coils, the detection signal from the detection member is transmitted as an electrical signal from the tool side to the main body side, thereby adjusting the supplied power based on the state of vibration of the ultrasonic transducer obtained from that detection signal.

However, when signal coils are placed on the rotating parts of the main body side and the tool side of the processing apparatus where the tool side is rotated in relation to the main body side, in order to maintain the opposing states of the main body side signal coil and the tool side signal coil, it is also necessary to install the signal coil coaxially with the tool side's rotating central axis along with the power coil. Locating the power coil and signal coil coaxially, especially with the signal coil, presents a possibility that the magnetic flux generated by the power coil will penetrate the signal coil and produce noise electromotive force in that signal coil, thus mixing noise in with the electrical signal it transmits.

In order to cope with this type of problem, Japanese Unexamined Patent Publication No. JP-A-11-354348 (Patent Document 3) and Japanese Unexamined Patent Publication No. JP-A-11-313491 (Patent Document 4) propose structures that avoid interference of mutual magnetic paths by enlarging the core component that forms the coil's magnetic path or that avoid interference of the mutual magnetic paths by interposing a non-magnetic material between the coils. However, enlarging the core component in the structures indicated in Patent Document 3 and Patent Document 4 leads to enlargement especially of the tool side. Since the tool side is rotated at high speed, if the tool side is enlarged, there is a possibility that it might be difficult to achieve stable rotation.

BACKGROUND ART DOCUMENTS

Patent Documents

Patent Document 1: JP-A-2002-28808
Patent Document 2: JP-A-2008-504138
Patent Document 3: JP-A-11-354348
Patent Document 4: JP-A-11-313491

SUMMARY OF THE INVENTION

Problem the Invention Attempts to Solve

The present invention was established in view of the above background, and, it is one object of the present invention to provide a processing apparatus with a novel structure in which the tool side rotates in relation to the main body side, capable of producing excellent quality transmission of the electrical signal from the tool side to the main body side with a simpler and more compact composition, and capable of driving the ultrasonic transducer provided on the tool side more effectively.

Means for Solving the Problem

The modes of the present invention that were established in order to . solve that problem are described hereinafter. Furthermore, the components used in each mode indicated below are, as much as possible, adoptable in the desired combinations.

A first mode of the present invention provides a processing apparatus, including: a main body side equipped with a power supply unit that outputs AC voltage; a tool side rotatable in relation to the main body side and equipped with an ultrasonic transducer to which the tool unit is connected; a pair of a primary power coil and a secondary power coil, which are disposed between a main body side and a tool side on a concentric axis with a rotating central axis of the tool side, wherein a drive power is supplied via the primary and secondary power coils from the power supply unit on the main body side to the ultrasonic transducer on the tool side, being characterized in that: a pair of signal coils are disposed between the main body side and the tool side such that the signal coils are located on a concentric axis with the power coils and stacked in an axial direction, respectively on the main body side and the tool side, a detection member is provided on the tool side for detecting a state of vibration of the ultrasonic transducer, and a detection signal from the detection member is transmittable via the signal coils from the tool side to the main body side, a power supply control member is provided on the main body side for controlling a power supply frequency to the primary power coil based on the detection signal from the detection member, and at least one of the signal coils on the main body side and the tool side, is provided with a coil winding path that generates mutually reverse electromotive forces in order to offset the electromotive forces generated in that signal coil due to an effect of a magnetic flux produced by the power coils.

In the processing apparatus with a structure in accordance with this mode, it is possible to transmit the electrical signal from the tool side to the main body side in a contact-free state by providing both the main body side and the tool side with a signal coil and utilizing the mutual induction of those signal coils. That way, the vibration state of the ultrasonic transducer detected using the detection member on the tool side can be transmitted to the main body side using the signal coils, and the main body side's power supply control member can be used to change the supplied power frequency from the received detection signal in accordance with changes in the state of vibration of the ultrasonic transducer, As a result, it becomes possible to perform feedback control according to changes in the resonant frequency of the ultrasonic transducer, the ultrasonic transducer can be driven more effectively, and it is possible to aim at improving processing accuracy.

Furthermore, at least one of the signal coils, either the one on the main body side or the one on the tool side, is formed with a coil winding path that offsets the effect from the electric power coil. Owing to this, when the magnetic flux that is generated by the power coil passes through the signal coils, the signal coils generate induced currents that are mutually reversed and that mutually offset each other. Thus, noise electromotive force can be reduced at the signal coils themselves without having to provide a separate noise control coil component, or to provide a power supply control device in order to negate that noise electromotive force. As a result, the transmission quality of the electrical signal can be improved through a simple configuration.

In addition, reducing the noise electromotive force at the signal coils themselves makes it possible to transmit the electrical signal faster. That is, in the case of wireless communication, for example, multi-stage processing is generally necessary wherein the received electrical signal is amplified after detection, noise is removed, and the signal is reproduced, and that takes time. Therefore, especially with feedback control like that in the present invention, if, after generating the detection signal at the tool side, it takes time to reproduce that signal at the main body side, it becomes necessary to take the time delay for that detection signal into consideration, which thus leads to more complex control. With the present invention, however, by providing a noise reduction effect in the very structure of the signal coils, it is possible to transmit the electrical signal faster and also improve the real-time quality of the signal transfer.

Further, because the effect from the power coils can be mitigated in the signal coils, it becomes possible to situate the signal coils in a more compact arrangement and stack them on the concentric axis with those power coils. As a result, it is possible to aim at miniaturization of the processing apparatus, especially miniaturization of the tool side. Thus, it is possible to achieve even faster rotation of the tool, and it is also possible to aim at improved stability of rotation and improved processing accuracy.

In this mode, "stacked" naturally means that the coil winding of the power coil and the coil winding of the signal coil are arranged in such a way that they overlap in the projection of those coils in the axial direction and that the coil windings of both coils are mutually contact-free. It does not mean that the coil windings of both coils are in a state of contact. In addition, the coil winding of the power coil and the coil winding of the signal coil may be overlapped generally over the whole of the circumference or may alternatively be overlapped so as to partially cross each other.

The second mode of the present invention provides the processing apparatus according to the first mode, wherein the coil winding path, which generates mutually reverse electromotive forces, includes a first winding portion and a second winding portion that are wound in mutually opposite directions.

Since, with this mode, the first winding portion and the second winding portion are mutually wound in opposite directions, mutually reverse induced currents are generated in relation to a common magnetic field in the first winding portion and the second winding portion. Owing to this, when the magnetic flux from the power coils passes through the signal coils, mutually reverse electromotive forces are generated in the first winding portion and second winding portion that mutually offset each other. As a result, it is possible to reduce the noise electromotive force that is generated in the signal coils.

Now, the winding direction of the mutually opposite-wound first winding portion and second winding portion refers to the direction around the center of the power coil. With the signal coil provided on the main body side, it means the direction around the center of the primary power coil, and with the signal coil provided on the tool side, it means the direction around the center of the secondary power coil. The number of winds for the first winding portion and the second winding portion is set as desired in consideration of the electromotive force generated in the first winding portion and electromotive force generated in the second winding portion. Ideally, it is set so that electromotive forces in mutually opposite directions that are equal in size are generated in the first winding portion and the second winding portion in relation to the common magnetic field. Therefore, the number of winds for the first winding portion and the number of winds for the second winding portion may be mutually different.

The third mode of the present invention provides the processing apparatus according to the second mode, wherein the first winding portion and the second winding portion, which is turned back from the first winding portion and wound conversely along the first winding portion, are formed on a same plane.

With this mode, it is possible to give the signal coils a thin form. Also, since the signal coils can also have a flat shape, setup work can be simplified, such as arranging them stacked together with the power coils.

The fourth mode of the present invention provides the processing apparatus according to any one of the first through third modes, wherein a pot core, which is made from a permeable-magnetic material and has a groove extending circumferentially, is provided on at least one of the main body side and the tool side, and both of the power coils and signal coils are housed in the groove.

With this mode, using a pot core to form the magnetic paths of the power coils and signal coils enables the transmission efficiency of both the power and the electrical signal to be improved. In addition, with the present invention, since, the adoption of a specially-configured coil winding path for the signal coils is able to reduce the effect from the power coils, the power coils and signal coils can be seated within the same groove in the pot core in order to aim at greater compactness. Furthermore, with the signal coils seated in the pot core groove, it is possible to protect the signal coils from disturbance due to magnetism, such as from a motor . installed in close proximity.

The fifth mode of the present invention provides the processing apparatus according to the fourth mode, wherein the pot core is provided solely on the main body side.

As mentioned above, it is known that an ultrasonic transducer is considered equivalent to the resonant circuit shown in FIG. 26 near a resonant frequency. The equivalent circuit shown in FIG. 26 consists of the damping capacitance (Cd) produced from the piezoelectric element, a part of the ultrasonic transducer and working as a capacitor, being connected in parallel with an LCR circuit, on which the coil section (L) and capacitor (C) that indicate the mechanical vibration characteristics (series resonance characteristics) and the resistance section (R) that indicates the mechanical load are connected in series.

Here, as this mode, by providing a pot core made from a permeable-magnetic material solely on the main body side and not including a core component on the tool side's secondary power coil, it is possible to avoid an increase in inductance (L) in the equivalent circuit on the tool side's ultrasonic transducer. Owing to that, it is possible to avoid large variations in resonant frequency $f_r=1/(2\pi\sqrt{(L \cdot C)})$. An increase in inductance (L), generally, appears as a drop in the resonant frequency $f_r$, so, by avoiding that increase in inductance (L), it is possible to suppress a drop in the resonant frequency $f_r$. This way, a high resonant frequency can be maintained for the ultrasonic transducer, the ultrasonic transducer can be driven at a high frequency, and a further improvement in processing accuracy can be aimed at. Also, because it is possible to avoid large changes in the resonant frequency $f_r$, the resonant frequency of the ultrasonic transducer can be easily brought close to the tool side's mechanically unique vibration frequency, the ultrasonic transducer's vibration can be effectively transmitted to the tool, and a more effective stroke can be obtained for the tool.

Furthermore, by not including a pot core on the tool side's secondary power coil, leakage flux can be aggressively produced between the primary power coil and the secondary power coil, and the coupling coefficient thus can be lowered. This can prevent a rapid drop in power transmission efficiency due to a slight displacement in relation to the main body side and improve the stability of power transmission. In addition, for example as shown in FIG. 27, when the drive power is oscillated from the main body side as a square wave, the power waveform input into the ultrasonic transducer on the tool side can be brought close to the sine wave, which is the mechanical vibration of the ultrasonic transducer that is also indicated in FIG. 27. It thus becomes easy to tune the vibration in the ultrasonic transducer with changes in the applied voltage and to reduce the deviations in the ultrasonic transducer that are thought to originate in rapid changes to the applied voltage, and it is possible to vibrate the ultrasonic transducer stably. Along with that, generation of the surplus energy that is indicated in FIG. 27 with slanted lines can be suppressed and the generation of heat can be suppressed as well.

And, by not including a pot core on the tool side's secondary power coil, the weight of the tool side can also be lightened and faster rotation is thus achieved. In this mode, in order to adjust the interlinkage flux on the tool side's signal coil, the tool side can be provided with a core component made of permeable-magnetic material and the tool side's signal coil can be attached to the core component. However, preferably, a mode is adopted that does not include a core component inclusive of a pot core on the tool side. That is to say, since, when the core component is formed from sintering particulates of iron and the like, the risk of cracking or breakage increases at high-speed r.p.m.s of around the 10 s of thousands. So, here, by not installing a core component on the tool side, it is possible to avoid the problem of the core component on the tool side being damaged.

The sixth mode of the present invention provide the processing apparatus according to any fourth or fifth mode, wherein a distance of separation between the first winding portion and the second winding portion is greater than a distance of separation to walls of the groove from both sides of the signal coil.

In this mode, the first winding portion of the signal coil is situated close to either the groove's outer wall or inner wall, and the second winding portion is situated close to the remaining outer wall or inner wall. The first winding portion and second winding portion are also situated closer to one of the groove's walls than to the other winding portion. Owing to this, the magnetic flux from the first winding portion and the magnetic flux from the second winding portion passes easily through each wall of the groove, and interference between the magnetic path of the first winding portion and the magnetic path of the second winding portion can be reduced. As a result, the transmission quality of the electrical signal from the signal coil can be heightened.

The seventh mode of the present invention provides the processing apparatus according to any one of the first through sixth modes, wherein the ultrasonic transducer is a Langevin transducer with multiple piezoelectric elements layered, and the detection member is composed of a piezoelectric element layered on those multiple piezoelectric elements.

With this mode, it is possible to use the piezoelectric effect of that piezoelectric element as a detection member to detect the vibration of the ultrasonic transducer as voltage and, therefore, achieve a detection member using a simple structure. Furthermore, because the piezoelectric element can be positioned as the detection member coaxially with the multiple piezoelectric elements that make up the Langevin transducer, that detection member can be provided with an efficient use of . space, and the stability of tool side rotation can also be improved by suppressing deviations in the tool side's weight balance.

Effect of the Invention

In the present invention, power is transmitted by the primary power coil and secondary power coil in a contact-free state from the main body side to the ultrasonic transducer located on the tool side. Besides, the signal coils installed on the main body side and the tool side turn the state of vibration of the ultrasonic transducer into an electrical signal and transmit it to the main body side. Since the power supply frequency to the ultrasonic transducer can be controlled by the power supply control member based on the electrical signal obtained through those signal coils, the supplied power frequency can be adjusted in accordance with changes in the ultrasonic transducer's resonant frequency, and processing quality can be improved. Furthermore, the signal coil on at least one side, either the main body side or the tool side, is given a coil winding path that offsets the electromotive force generated by the magnetic flux effect coming from the power coil. In this way, it is possible, using an extremely simple structure, to reduce the noise electromotive force that is generated in the signal coil due to the effects from the power coil. As a result, it is possible to improve the transmission quality of the electrical signal and, because the signal coils can be situated in close proximity to the power coil, downsizing of the main body side and the tool side can be pursued.

EMBODIMENTS FOR CARRYING OUT THE INVENTION

The following describes the embodiments of the present invention with reference to the drawings.

Figure 1:
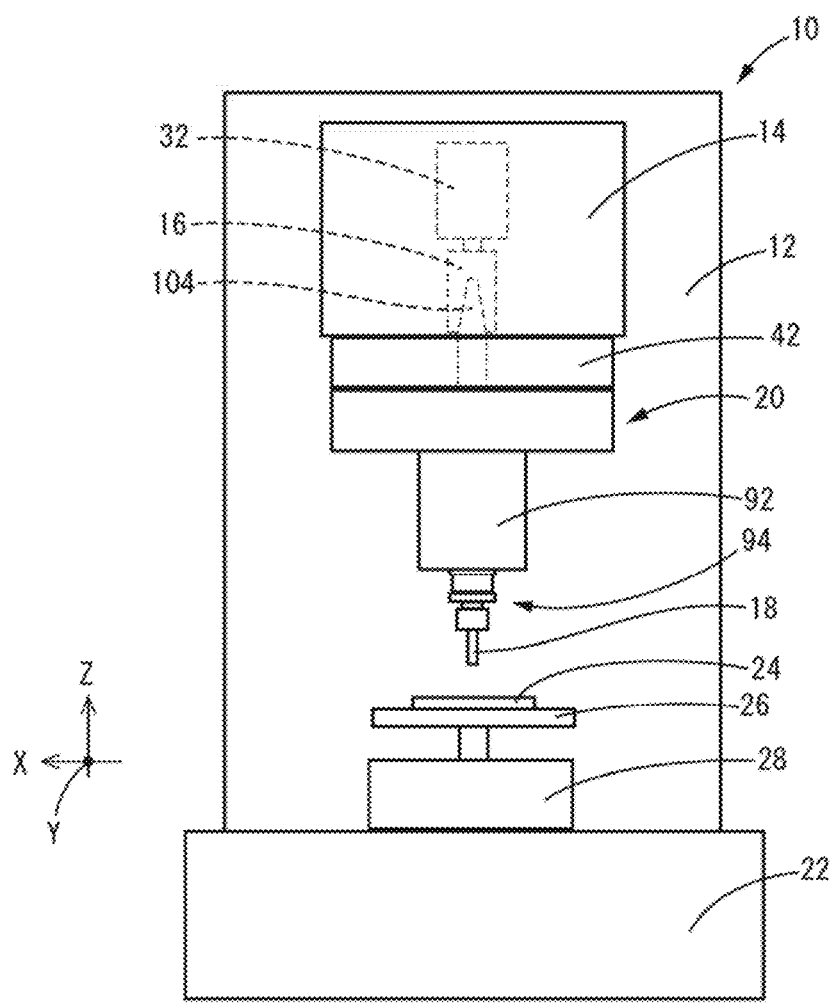
FIG. 1 is a view depicting in model form a processing apparatus described according to a first embodiment of the present invention.

First, a processing apparatus 10 according to a first embodiment of the present invention is shown in model form in FIG. 1. The processing apparatus 10 is given a structure wherein a tool unit 20, equipped with a tool 18 and functioning as a tool side, is connected to a spindle 16 of a spindle head 14, which is situated in an equipment main body 12 functioning as a main body side. By rotating the spindle 16, the tool unit 20, which is connected to the spindle 16, can be rotated in relation to the spindle head 14.

The equipment main body 12 is supported by a base 22. A table 26, which holds a workpiece 24 being processed in a manner that enables attachment and detachment, is installed on the base 22 facing the tool 18 (below the tool 18 in FIG. 1). The table 26 is supported by a drive mechanism 28 on the base 22 and, with a guide rail and servo motor, etc. (not shown in the drawing), provided inside the drive mechanism 28, it can be relatively offset in relation to the tool 18 in the orthogonal triaxial directions of the X-axis direction and Y-axis direction orthogonal to the forward-backward direction (up-down direction in FIG. 1) of the tool 18 and of the Z-axis direction, which is the forward-backward direction of the tool 18. In this way, a relative offset of the tool 18 in relation to the workpiece 24 in the orthogonal triaxial directions is made possible. It would also be acceptable that, in the processing apparatus 10, the table 26, for example, can be made movable in the orthogonal biaxial directions of the X-axis and Y-axis and the spindle head 14 can be made movable in the Z-axis direction.

Figure 2:
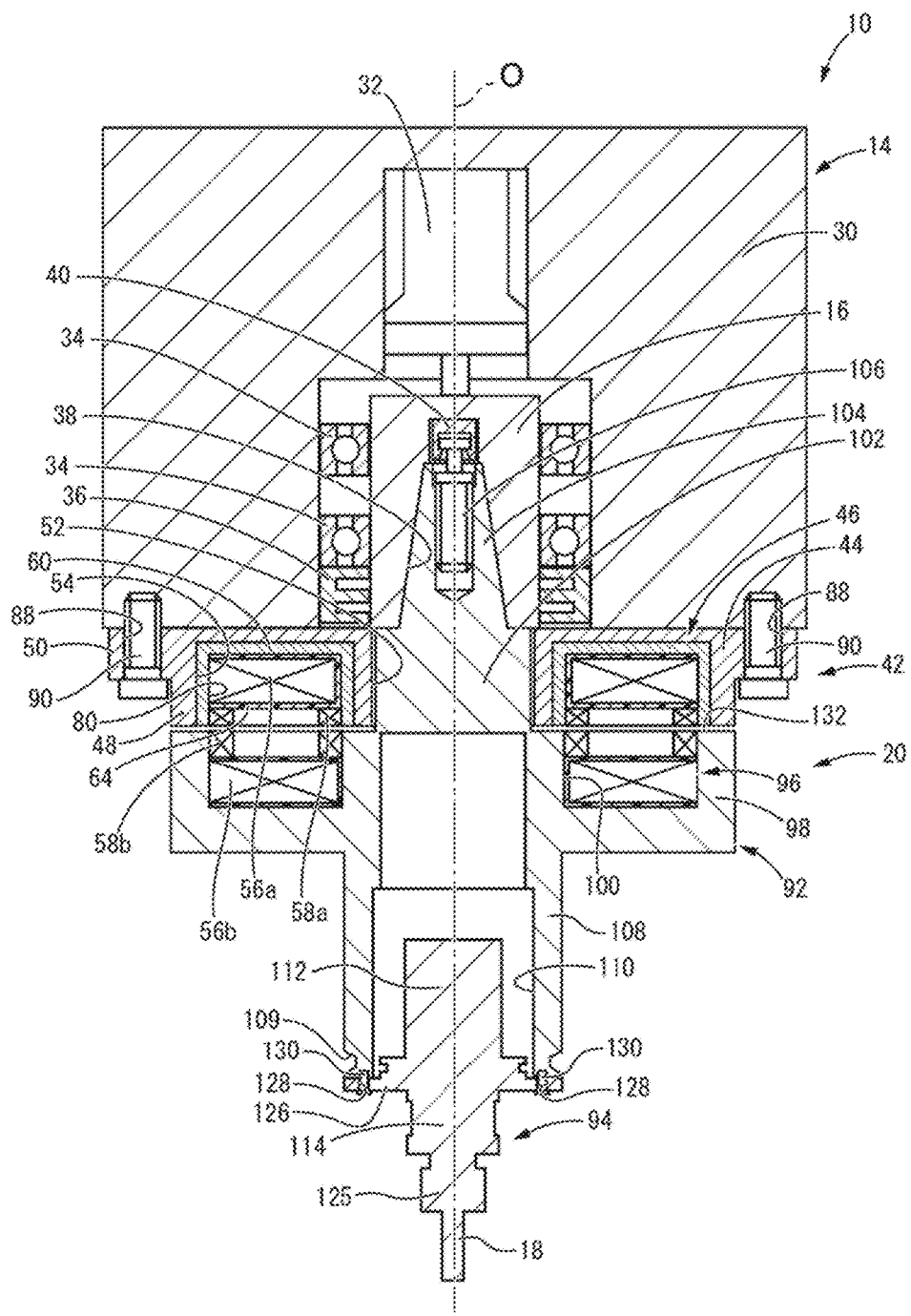
FIG. 2 is a longitudinal cross sectional view of a principle part of the processing apparatus shown in FIG. 1.

FIG. 2 shows the longitudinal section of the spindle head 14 and the tool unit 20 in model form. In the spindle head 14, a motor 32 is situated within a casing 30 as a means of rotational drive. By affixing the spindle 16 to the output shaft of the motor 32, the spindle 16 can be rotated around central axis O. The spindle 16 is supported by the casing 30 via bearings 34, 34, and its tip is positioned nearly equal to the edge of the casing 30 of the tool unit 20 side. Also, a labyrinth seal 36 is provided at the tip of the spindle 16 between the spindle 16 and the casing 30, so that foreign substances, such as particulates, are prevented from infiltrating inside the casing 30 from the outside.

A unit attachment hole 38, which has a tapered inner circumferential surface flaring towards the tip edge of the spindle 16, is formed at the tip of the spindle 16. A pull chuck 40, which holds a pull stud 106 installed in the tool unit 20 (to be described later), is installed inside the spindle 16, namely, on the inside surface of the end of the unit attachment hole 38 in the axial direction of the spindle 16 where the diameter decreases.

Figure 3:
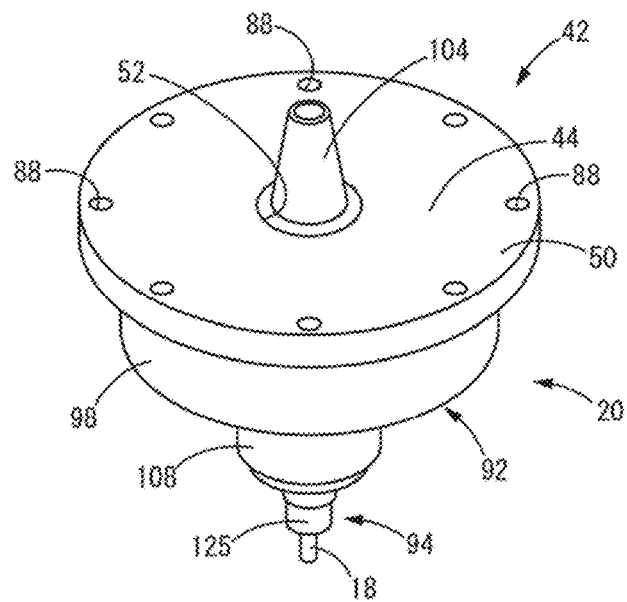
FIG. 3 is a perspective view of a main body side transmission unit and a tool unit.
Figure 4:
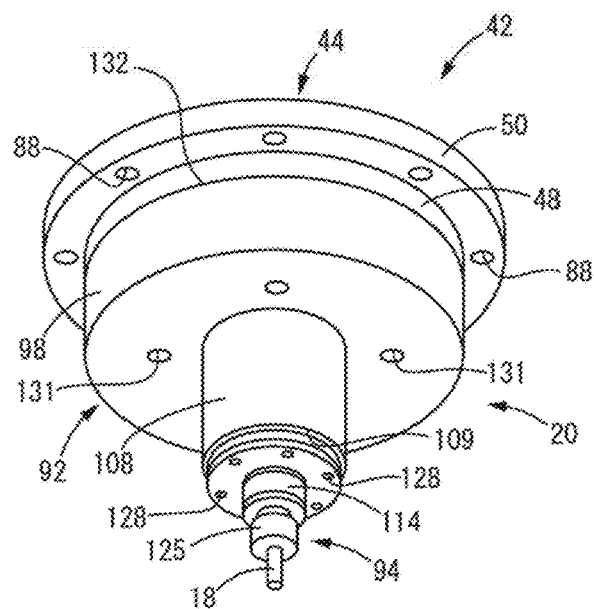
FIG. 4 is a perspective view of the main body side transmission unit and the tool unit from a different direction than FIG. 3.

A main body side transmission unit 42 is attached to the edge of the casing 30 of the tool unit 20 side. FIG. 3 and FIG. 4 show both the main body side transmission unit 42 and the tool unit 20. The main body side transmission unit 42 is configured with a main body side coil head 46 (see FIG. 2) situated in a main body side housing 44. The main body side housing 44 is an integrally molded part, made of, for example, stainless steel, including a center section 48 of generally cylindrical external form and a flange-shaped portion 50 projecting from one axial edge of the center section 48 outward in a radial direction over the whole of the circumference. A rod insertion hole 52, which penetrates through the central axis, is formed in the center section 48. Furthermore, a main body side seating groove 54 is formed around the circumference of the rod insertion hole 52 in the center section 48, opening to the tool unit 20 side (bottom of FIG. 2), and continuously extending over the whole of the circumference around the central axis of the center section 48.

Figure 5:
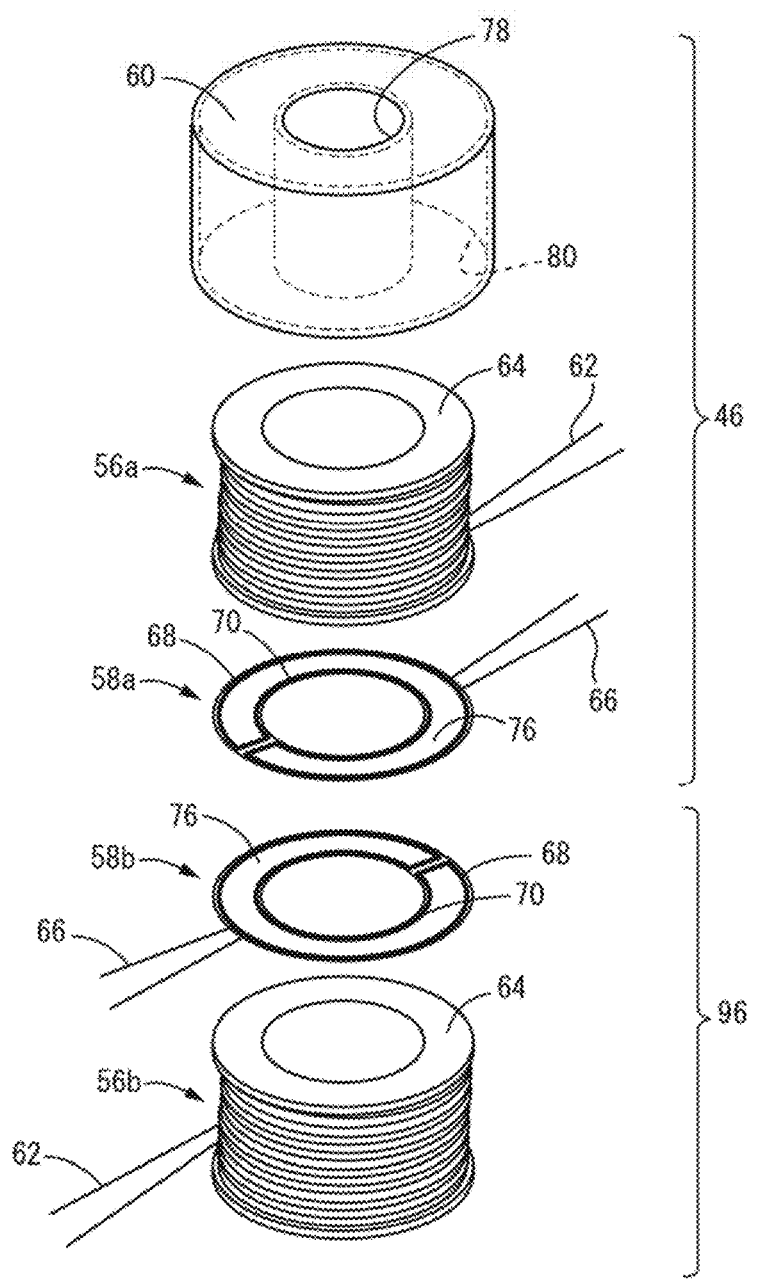
FIG. 5 is an exploded perspective view of a primary power coil, a secondary power coil, signal coils and a pot core.

The main body side coil head 46 is seated in the main body side seating groove 54. As shown in FIG. 5 along with a tool side coil head 96 (to be described later), the main body side coil head 46 has a structure in which a primary power coil 56a and, as the signal coil, a main body side signal coil 58a, are held in the core component, a pot core 60. The primary power coil 56a is formed by a lead wire 62 as a coil winding, which is made of copper or the like, being circularly wound a specified number of times. The size and number of winds of the primary power coil 56a can be set as desired in consideration of the size of the power being transmitted, etc. In this embodiment, the primary power coil 56a is formed by the lead wire 62 being wound around a generally cylindrical bobbin 64, which is made of a synthetic resin or the like, but the bobbin 64 is not necessarily required.

Meanwhile, the main body side signal coil 58a is formed by a lead wire 66 as a coil winding, which is made of copper or the like. As shown in model form in FIG. 6, the main body side signal coil 58a is, on the whole, cylindrically shaped, and a first winding portion 68, wound on radially outside, and a second winding portion 70, wound on radially inside and in the opposite direction from that of the first winding portion 68, are composed of the single lead wire 66.

Figure 6:
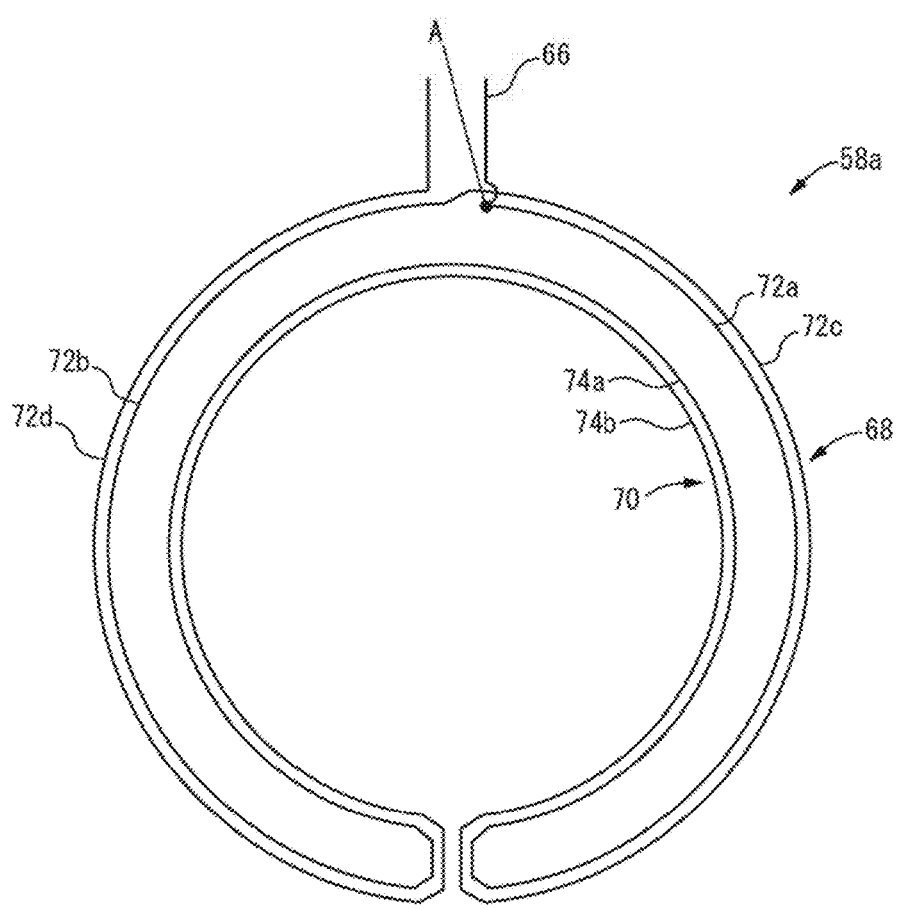
FIG. 6 is a view depicting in model form the signal coil shown in FIG. 5.

Concretely, starting from Point A in FIG. 6, the lead wire 66 is wound approximately half-way around to form an outer winding portion 72a. It is then turned inward in the radial direction and, in the direction opposite from that of the outer winding portion 72a (counter-clockwise in FIG. 6), wound on radially inside approximately one full circle to form an inner winding portion 74a. The lead wire 66 is then turned outward in the radial direction from the inner winding portion 74a and, in the direction opposite from that of the inner winding portion 74a (clockwise in FIG. 6), wound on radially outside approximately half-way around, returning to Point A to form an outer winding portion 72b. An outer winding portion 72c, an inner winding portion 74b, and an outer winding portion 72d are also formed, in that order, by repeating this procedure. In this way, the first winding portion 68 is formed by outer winding portions 72a to 72d and the second winding portion 70 is formed by inner winding portions 74a and 74b. In short, the lead wire 66 is wound on the outside approximately half-way around, turned inward, wound in the opposite direction approximately one full circle on the inside, turned outward and wound approximately half-way around the remaining outside distance. By so doing, the first winding portion 68, which is wound in a single direction, is formed on the outside of the main body side signal coil 58a (clockwise in FIG. 6), while the second winding portion 70, which is turned inward from the first winding portion 68 and wound, along but in the opposite direction to that of the first winding portion 68 (counter-clockwise in FIG. 6), is formed on the inside of the main body side signal coil 58a. The number of winds for the main body side signal coil 58a can be set as desired by then repeating this procedure. Though, in order to facilitate understanding, FIG. 6 shows the lead wire 66 as not overlapping, the lead wire 66 may overlap on each of the first winding portion 68 and the second winding portion 70.

In this embodiment, the main body side signal coil 58a has a circular shape of a size approximately equivalent to that of the primary power coil 56a. Besides, the first winding portion 68 and the second winding portion 70 are each wound in a generally circular shape and are formed on the same plane and on the concentric axis. As shown in FIG. 5, the winding shape of the main body side signal coil 58a is maintained by having the lead wire 66 fixed with adhesive or the like to a thin, annular-shaped retainer plate 76, which is made of a synthetic resin or the like. However, the retainer plate 76 is not necessarily required.

The primary power coil 56a and the main body side signal coil 58a are seated in the pot core 60. The pot core 60 is made of a permeable-magnetic material, for example iron, silicon steel, permalloy, or ferrite. The pot core 60 has a cylindrical shape that is pierced by a center hole 78, which extends over the central axis, and includes a circular groove 80 formed as a groove that opens in one axial direction and extends around the central axis. The circular groove 80 is a retaining recess that holds the primary power coil 56a and the main body side signal coil 58a. Various forms can be adopted as the concrete shape of the pot core 60; i.e., the pot core 60 can be an integrally molded part or can be made from multiple components, for example, the 3 portions of an external wall 82, an internal wall 84 and the bottom wall of the circular groove 80 being adhered together. In addition, the external wall 82 can be circumferentially divided into multiple portions, for example, and the materials forming the pot core 60 can be arranged in close proximity to the primary power coil 56a and the main body side signal coil 58a.

The main body side coil head 46 is formed with the primary power coil 56a and the main body side signal coil 58a being seated in the circular groove 80. In this embodiment, the primary power coil 56a and the main body side signal coil 58a are placed in the pot core 60 in that order, but the order in which they are arranged in the pot core 60 may be reversed. Thus, as shown in FIG. 2, the primary power coil 56a is encased in the pot core 60, and the primary power coil 56a and the main body side signal coil 58a are seated in the circular groove 80 on approximately concentric axis and with their respective lead wires 62 and 66 (see FIG. 5) overlapping in the axial direction (up-down direction in FIG. 2). By thus arranging the primary power coil 56a and the main body side signal coil 58a on approximately concentric axis, the first winding portion 68 and the second winding portion 70 of the main body side signal coil 58a are wound in mutually opposite directions around the center of the primary power coil 56a. And, as the bobbin 64 intervenes between the primary power coil 56a and the main body side signal coil 58a, the primary power coil 56a and the main body side signal coil 58a are separated by that gap, preventing contact of their mutual lead wires, 62 and 66.

Figure 7:
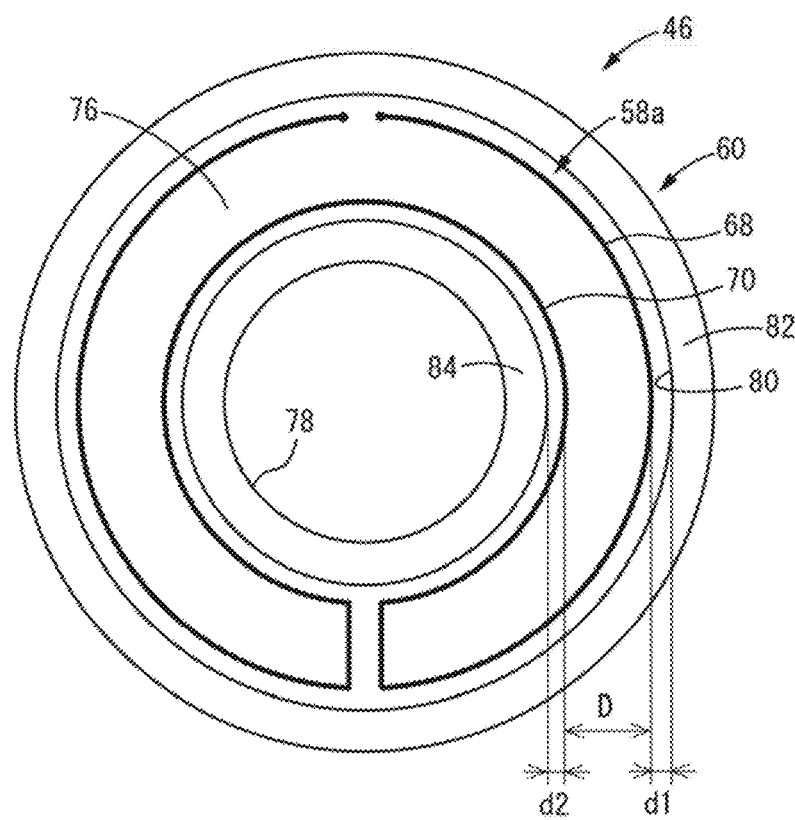
FIG. 7 is a front view of a main body side coil head.

Also, as shown in FIG. 7, with the main body side signal coil 58a seated in the circular groove 80, the first winding portion 68 of the main body side signal coil 58a is situated on the external wall 82 side of the circular groove 80, and the second winding portion 70 is situated on the internal wall 84 side of the circular groove 80. This way, the first winding portion 68 and the second winding portion 70 are positioned apart, and the distance D between the first winding portion 68 and the second winding portion 70 in the radial direction of the pot core 60 is larger than both the distance d1 between the external wall 82 and the first winding portion 68, situated on the outer portion of the main body side signal coil 58a, and the distance d2 between the internal wall 84 and the second winding portion 70, situated on the inner portion of the main body side signal coil 58a. In other words, the first winding portion 68 is positioned closer to the external wall 82 side than to the second winding portion 70, and the second winding portion 70 is positioned closer to the internal wall 84 side than to the first winding portion 68.

This main body side coil head 46 is seated in the main body side seating groove 54 of the main body side housing 44 and affixed through adhesion, press fitting, etc., with the circular groove 80 of the pot core 60 facing open to the tool unit 20 side. This way, the outside of the main body side coil head 46 is covered with the main body side housing 44, which is made of, for example, stainless steel or the like, and, with the main body side housing 44 functioning as a shield component, the leakage flux from the pot core 60 is reduced and the main body side signal coil 58a especially is protected from being disturbed by magnetism such as from the external motor 32. It is also possible to provide the shield component separately, for example, by forming a shield component of a non-magnetic material like an aluminum alloy, copper alloy, titanium alloy, nickel alloy, ceramic, or synthetic resin, and the main body side coil head 46 may be seated in the main body side seating groove 54 with its exterior covered by that shield component.

As above, the main body side transmission unit 42 is fixed firmly to the casing 30 by overlaying the flange-shaped portion 50 on the casing 30 and inserting fixing bolts 90 into bolt holes 88 that are opened at multiple locations on the flange-shaped portion 50.

On the other hand, as shown in FIG. 2 to FIG. 4, the tool unit 20 has a structure in which parts like a vibration unit 94 and the tool side coil head 96 are installed on a rotation housing 92. The rotation housing 92 is made, for example, of stainless steel or the like. A coil head holder 98, which has a generally cylindrical external shape, is formed in the rotation housing 92. The external dimensions of the coil head holder 98 are substantially the same as the external dimensions of the center section 48 of the main body side transmission unit 42. A rotation side seating groove 100 is formed in the coil head holder 98 so as to open to the main body side transmission unit 42 side (upper side in FIG. 2) and extend continuously over the whole of the circumference around the central axis of the coil head holder 98. Furthermore, a rod section 102 is formed in the rotation housing 92 on the central axis of the coil head holder 98 and projecting from the coil head holder 98 toward the side of the main body side transmission unit 42. The rod section 102 has a slightly smaller outside diameter than the inner diameter of the rod insertion hole 52 on the main body side transmission unit 42, and it is of a cylindrical shape with an axial direction length substantially the same as the length of the rod insertion hole 52 in the axial direction (up-down directional length in FIG. 2). Equipped with a tapered circumference surface, a shank 104 is formed on the central axis at the tip of the rod section 102, which protrudes from the coil head holder 98, and projects further into the main body side transmission unit 42, adhering to the inner circumferential surface of the tapered unit attachment hole 38, which is formed in the spindle 16. A screw hole is provided on the central axis of the shank 104 and the rod-shaped pull stud 106 is screwed into that screw hole. Furthermore, a generally cylindrical housing 108 is formed in the rotation housing 92, projects from the coil head holder 98 in the opposite direction from the shank 104, and extends along the central axis. A groove-shaped V-flange 109 is formed on the circumference surface of the housing 108 and is held by the arm of an Automatic Tool Changer (ATC) (not shown in the drawing). A vibration unit seating hole 110, which opens onto the opposite side of the main body side transmission unit 42 (bottom in FIG. 2), is formed by the inner cavity of the housing 108 connecting to a cavity formed in the center of the coil head holder 98.

Figure 8:
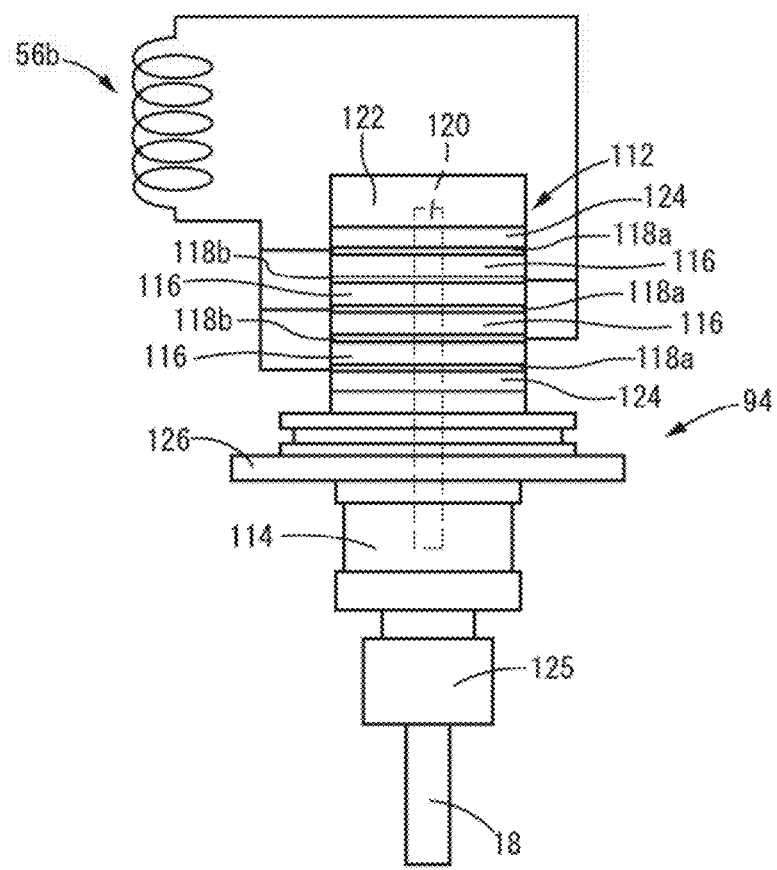
FIG. 8 is a view of a vibration unit equipped with an ultrasonic transducer.

The vibration unit 94 is situated in and partially held by the vibration unit seating hole 110. FIG. 8 shows the vibration unit 94 in model form. The vibration unit 94 includes the tool 18 connected to an ultrasonic transducer 112 through a horn 114. The ultrasonic transducer 112 is a so-called bolt-clamped Langevin transducer, including annular-shaped multiple piezoelectric elements 116 formed from, for example, a ceramic sheet with a piezoelectric effect, and annular-shaped electrodes 118a and 118b externally fitted around and alternately layered on a bolt 120. Also, the ultrasonic transducer 112 is sandwiched between a metal block 122 and the horn 114 and screwed into the bolt 120 from both sides. Each of the electrodes 118a and 118b, which are alternately layered, is connected to a secondary power coil 56b (to be described later). The number of layers of the piezoelectric elements 116 is set as desired in consideration of the required stroke for the tool 18.

Also, especially in this embodiment, insulating layers 124 and 124 are respectively provided between the metal block 122 and the electrode 118a of piezoelectric element 116, and between the horn 114 and the electrode 118a of the piezoelectric elements 116, which are the two sides that sandwich the layered piezoelectric elements 116. These insulating layers 124 are formed from a non-conducting material that does not easily deform elastically, for example, a ceramic brittle material. Due to this, the vibration of the ultrasonic transducer 112 is effectively transmitted to the horn 114, and the danger of electric shock, etc., can be avoided. The tool 18 is attached to the tip of the horn 114 through a chuck mechanism 125 like a collet or shrink fitting. In this way, the vibration of the ultrasonic transducer 112 is amplified at the horn 114 and transmitted to the tool 18. Various items can be adopted for use as the tool 18, for example, an endmill or a drill. Also, the concrete shape and material of the horn 114 can be appropriately set in consideration of the quality of the material of the workpiece 24 or the vibration conditions of the tool 18. For example, the horn 114 can be formed in multiple levels or can be formed individually. Various forms can also be adopted for the shape of the horn 114, for example, stepped, exponential, catenoidal, or conical, and various materials can also be adopted as the material of the horn 114, for example, titanium, an aluminum alloy, steel, a copper alloy, or a non-metal such as synthetic resin.

This vibration unit 94 is attached to the rotation housing 92. For example, in this embodiment, as shown in FIG. 2, with the ultrasonic transducer 112 side of the vibration unit 94 seated within the vibration unit seating hole 110 on the rotation housing 92, a flange-shaped portion 126, which is formed in the vibration unit 94, is laid on top of the open edge of the vibration unit seating hole 110, and attached to the rotation housing 92 by screwing fixing bolts 130 through bolt holes 128. penetrating the flange-shaped portion 126 and into the open edge of the vibration unit seating hole 110. However, there are no restrictions to the concrete structure for attaching the vibration unit 94 to the rotation housing 92. Thus, the tool 18 on the vibration unit 94 projects from the rotation housing 92 and is installed on the concentric axis as the shank 104 and the coil head holder 98.

Also, as shown in FIG. 5, the tool side coil head 96 includes the secondary power coil 56b and, as the signal coil, a tool side signal coil 58b. Because the secondary power coil 56b and the tool side signal coil 58b are respectively of a similar structure to the primary power coil 56a and the main body side signal coil 58a provided on the main body side coil head 46, the same numbering has been used in the drawings and separate explanations have been omitted. Specifically, the tool side coil head 96 corresponds to the main body side coil head 46 without the pot core 60, and has a similar structure to the main body side coil head 46, excluding the pot core 60. Therefore, while the pot core 60 is provided as the core component encasing the primary power coil 56a in the spindle head 14, a core component encasing the secondary power coil 56b is not provided in the tool unit 20. The tool side coil head 96 positions the tool side signal coil 58b on the main body side coil head 46 side, and is seated in the rotation side seating groove 100 of the coil head holder 98 in the rotation housing 92 and affixed through pressure and adhesion, etc. Although a detailed drawing has been omitted, multiple pin insert holes 131 (see FIG. 4) are opened circumferentially at appropriate intervals on the bottom of the coil head holder 98 in the rotation housing 92, and, by inserting whirl-stop pins (not shown in the drawing) into these pin insert holes 131 and engaging them to the tool side coil head 96, rotation of the tool side coil head 96 inside the rotation side seating groove 100 is prevented.

In this type of structure, the shank 104 side of the tool unit 20 is inserted into the rod insertion hole 52 in the main body side transmission unit 42, as shown in FIG. 2, using an ATC or the like, for example (not shown in the drawing). The shank 104 penetrates the main body side transmission unit 42, and is inserted into the unit attachment hole 38, which is formed in the spindle 16. With the pull stud 106 being held by the pull chuck 40, the tool unit 20 is affixed to the spindle 16. In this way, the main body side transmission unit 42 and the tool unit 20 are positioned in opposition in the direction of rotating central axis O of the spindle 16. The main body side transmission unit 42 and the tool unit 20 are arranged in a contact-free state with a slight gap between them, and an airflow path 132 is formed by the gap between the rod insertion hole 52 on the main body side transmission unit 42 and the rod section 102 on the tool unit 20 as well as the gap between the main body side coil head 46 on the main body side transmission unit 42 and the tool side coil head 96 on the tool unit 20. With this arrangement, the main body side coil head 46 and the tool side coil head 96 are coaxially situated with each other on the central axis O of the spindle 16, and positioned with a gap and in opposition in the axial direction of the spindle 16 (up-down direction in FIG. 2). By rotating the spindle 16 with the motor 32, the tool unit 20 rotates in relation to the spindle head 14, thus rotating the tool 18, and the tool side coil head 96 rotates relative to the main body side coil head 46 around the central axis O of the spindle 16. That way, the primary power coil 56a and the main body side signal coil 58a, provided on the main body side coil head 46, and the secondary power coil 56b and the tool side signal coil 58b, provided on the tool side coil head 96, are arranged in opposition, separated by a gap, on the concentric axis with the central axis O of the spindle 16, which is the rotational center of the tool unit 20, and are allowed relative rotation around central axis O.

Figure 9:
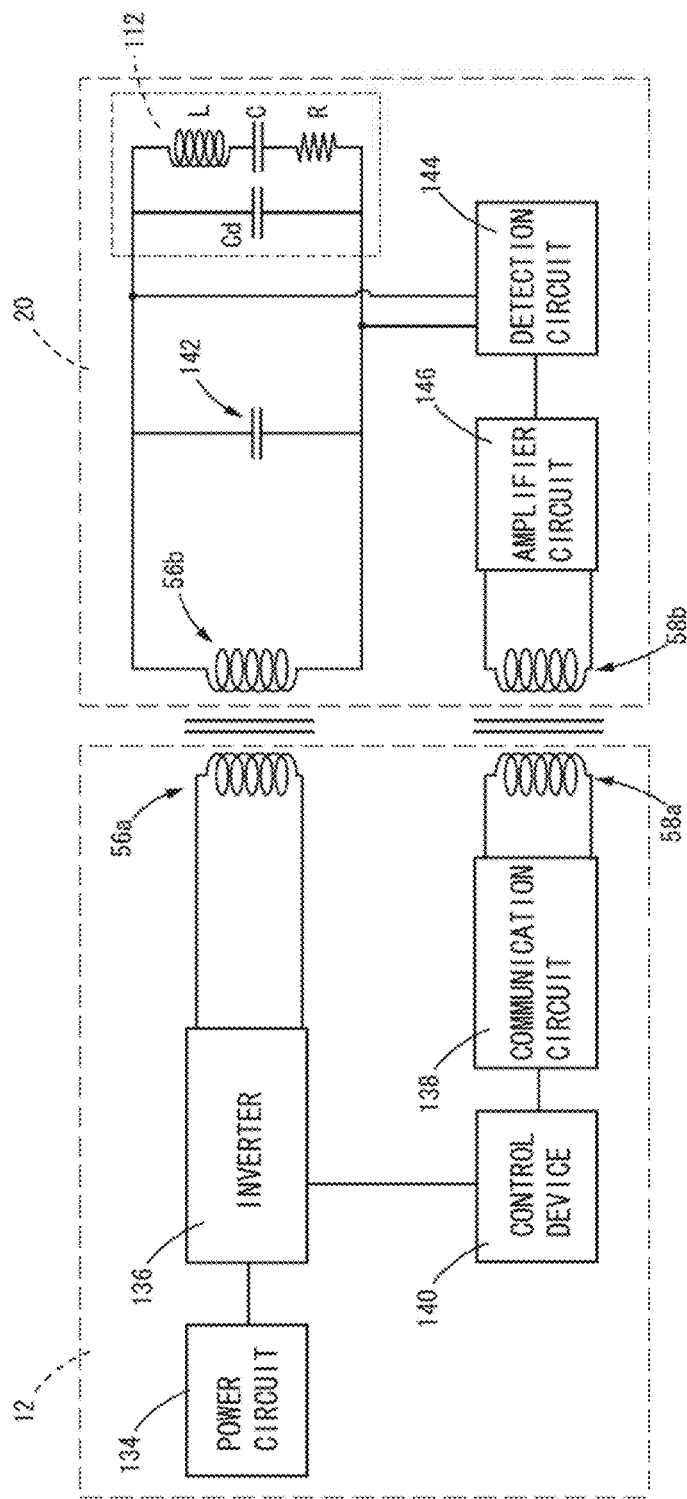
FIG. 9 is a block diagram that summarizes a contact-free power supply unit used in the processing apparatus according to the first embodiment of the present invention.

With the main body side coil head 46 and the tool side coil head 96, for example, as shown in FIG. 9, a power circuit 134, which supplies DC power, is connected to the primary power coil 56a via an inverter 136 on the equipment main body 12 side where the spindle head 14 is provided. The power circuit 134 and the inverter 136 are both arranged on the equipment main body 12 side. A control device 140 is connected to the main body side signal coil 58a through a communication circuit 138, which is equipped with a demodulator circuit. The communication circuit 138 and the control device 140 are also located on the equipment main body 12 side. The control device 140 is equipped with a CPU, ROM and RAM, etc., and it adjusts the drive frequency of the inverter 136 in accordance with the electrical signal received from the communication circuit 138 and a predetermined program.

On the other hand, on the tool unit 20 side, the ultrasonic transducer 112 is connected to the secondary power coil 56b. As mentioned above, the ultrasonic transducer 112 can be considered as equivalent to the resonant circuit shown in FIG. 9. And, as also shown in FIG. 9, a correcting capacitor 142 may be provided in parallel with the ultrasonic transducer 112 as necessary to offset the electrical current that flows through the damping capacity (Cd) of the ultrasonic transducer 112. Furthermore, a detection circuit 144 is connected to the ultrasonic transducer 112 as a detection member, and the detection circuit 144 is connected to the tool side signal coil 58b through an amplifier circuit 146. The detection circuit 144 is, for example, configured with a Hall element or the like and detects the voltage applied to the ultrasonic transducer 112, as well as the electrical current that flows through the ultrasonic transducer 112, as the state of vibration of the ultrasonic transducer 112. The detection circuit 144 and the amplifier circuit 146 are installed on the tool unit 20 side.

The contact-free power supply unit includes the main body side coil head 46, the tool side coil head 96, the power circuit 134, the inverter 136, the communication circuit 138, the control device 140, the detection circuit 144 and the amplifier circuit 146, and the power supply unit that outputs AC voltage to the primary power coil 56a is composed of the power circuit 134 and the inverter 136.

With the processing apparatus 10 in this embodiment, drive power can be supplied from the equipment main body 12 as the main body side to the ultrasonic transducer 112, installed on the tool unit 20, as the tool side. By detecting the state of vibration of the ultrasonic transducer 112, if the resonant frequency of the ultrasonic transducer 112 has changed due to a mechanical load applied to the ultrasonic transducer 112 or due to changes in temperature conditions, it is possible to efficiently drive the ultrasonic transducer 112 by performing feedback control that changes the frequency of the applied voltage to the ultrasonic transducer 112. Hereafter is an example of the supply of drive power to the ultrasonic transducer 112 and of feedback control.

First of all, the premise is that the ultrasonic transducer 112, composed of the multiple piezoelectric elements 116, can be considered as equivalent, in the neighborhood of the resonant frequency, to the circuit shown in FIG. 9. That equivalent circuit is known to have the impedance characteristics shown in FIG. 10, and the frequency with the least amount of impedance (Z) is the resonant frequency $f_r$ of the ultrasonic transducer 112. The ultrasonic transducer 112 vibrates with the most efficiency when the AC voltage of resonant frequency $f_r$ is applied and a large amplitude can be achieved. At resonant frequency $f_r$, the phase difference of the voltage and the electrical current that flows through the ultrasonic transducer 112 is 0 and the largest electrical current flows through the ultrasonic transducer 112. Also, the frequency at which the impedance (Z) is largest is antiresonant frequency $f_n$.

Figure 11:
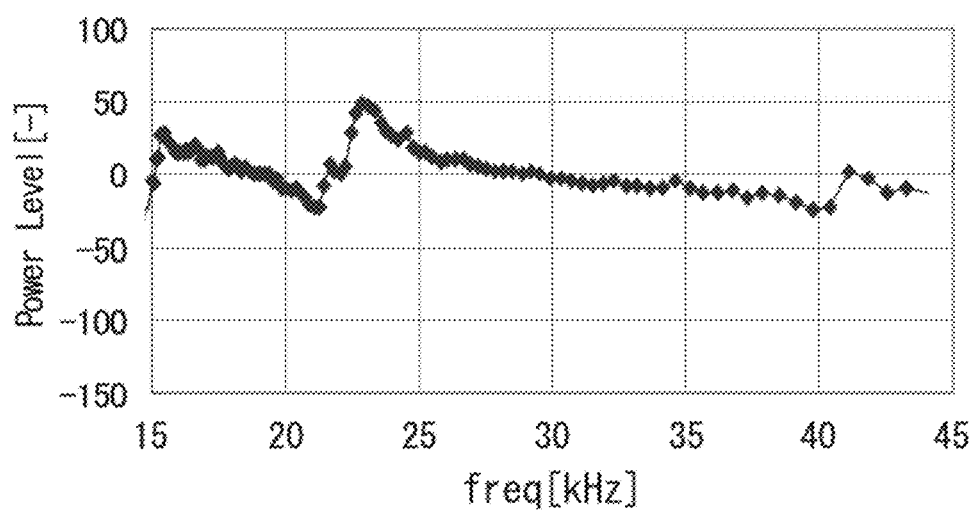
FIG. 11 is a graph that displays the results of measurement of the electrical current that flows through the ultrasonic transducer.

Here, as prior preparation, an AC voltage is applied to the ultrasonic transducer 112, for which the frequency is changed gradually at the predetermined intervals of, for example, 0.1 kHz, 0.5 kHz and 1 kHz over a predetermined range that sandwiches the resonant frequency estimated to a certain degree from the make-up of piezoelectric element 116, and the electrical current that flows through the ultrasonic transducer 112 is measured. For example, if it is supposed that the resonant frequency $f_r$ of the ultrasonic transducer 112 resides in the neighborhood of 20 kHz, the electrical current that flows through the ultrasonic transducer 112 is measured by changing the applied voltage from 10 kHz to 40 kHz. An example of the results of measuring the electrical current that flows through the ultrasonic transducer 112 is shown in FIG. 11. From the measurement results obtained, we can suppose that the resonant frequency $f_r$ of the ultrasonic transducer 112 exists near the frequency (approx. 23 kHz in FIG. 11) at which the largest electrical current flowed.

Figure 10:
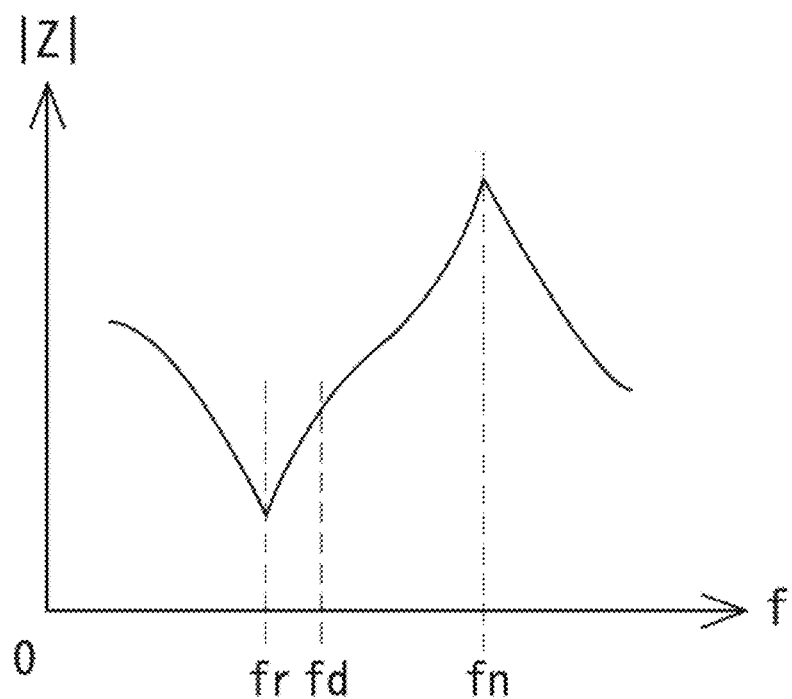
FIG. 10 is a graph that displays the ultrasonic transducer's impedance characteristics.
Figure 12:
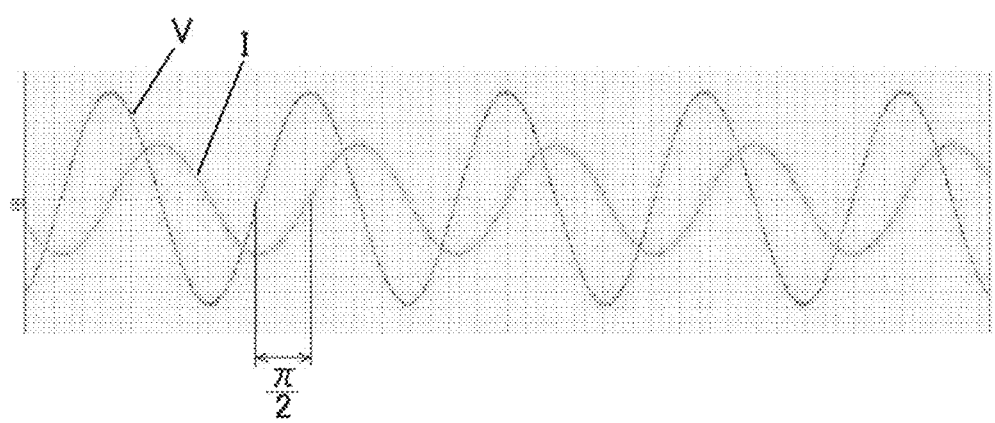
FIG. 12 is a graph that displays the results of measurement of the voltage and electrical current in the neighborhood of the ultrasonic transducer's resonant frequency.
Figure 13:
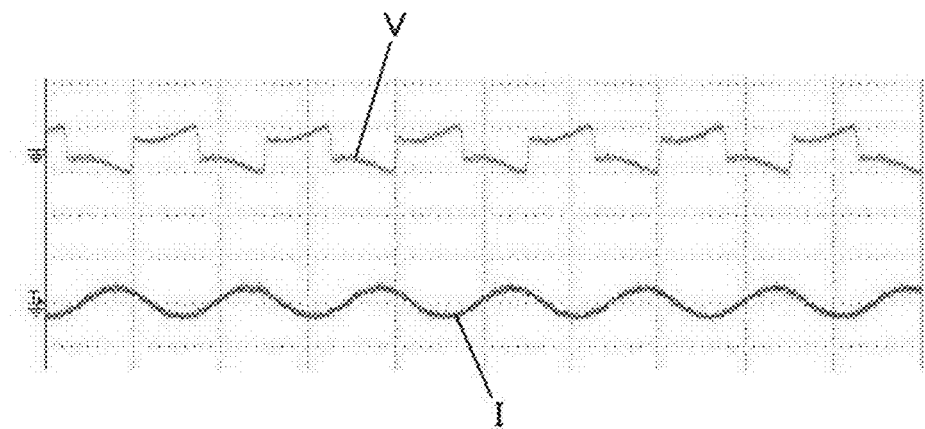
FIG. 13 is a graph that displays the results of measurement of the voltage and electrical current in a frequency range outside the neighborhood of the ultrasonic transducer's resonant frequency when a square wave voltage is applied.
Figure 14:
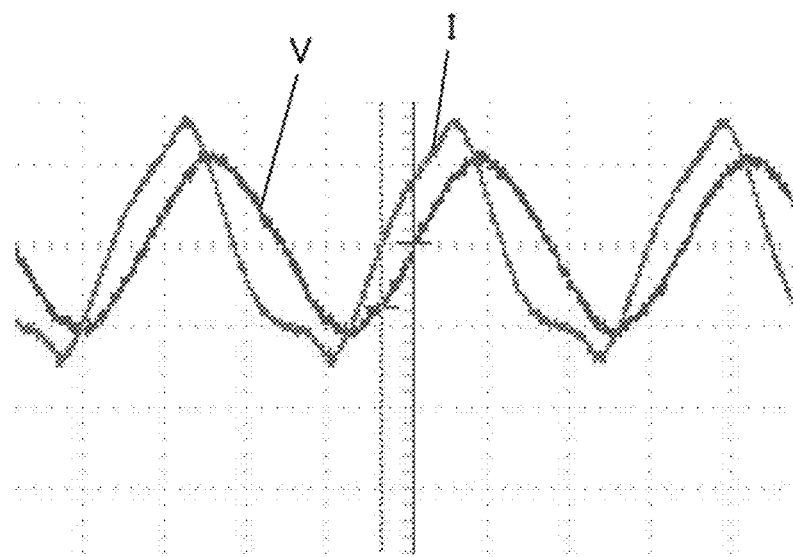
FIG. 14 is a graph that displays the results of measurement of the voltage and electrical current in a frequency range outside the neighborhood of the ultrasonic transducer's resonant frequency when a sine wave voltage is applied.

As mentioned above, the ultrasonic transducer 112 is driven most efficiently at resonant frequency $f_r$. However, as is clear from FIG. 10, the change in impedance (Z) near resonant frequency $f_r$ is steep, and the state of vibration of the ultrasonic transducer 112 changes sharply with only a slight deviation from resonant frequency $f_r$. Thus, in this embodiment, a position slightly shifted from resonant frequency $f_r$, and between resonant frequency $f_r$ and antiresonant frequency $f_n$ in FIG. 10, is set as drive frequency $f_d$ in order to ensure stability in driving the ultrasonic transducer 112. Concretely, a voltage is applied wherein the phase difference between the voltage and electrical current is within the range of $(\pi/2) \pm (\pi/4)$ and, in this embodiment, as the actual measurement results in FIG. 12 show, an AC voltage of drive frequency $f_d$ is applied for which the phase difference is $\pi/2$. FIG. 13 and FIG. 14 show actual measurement results for the ultrasonic transducer 112 when the voltage of a frequency range that is outside the neighborhood of the resonant frequency is applied. FIG. 13 shows the results when a square wave is input as AC voltage and the amplitude of the electrical current is small. FIG. 14 shows the results when a sine wave is input as AC voltage and, because the electrical oscillation is unstable, a state of dissonance can be confirmed.

Now, the motor 32 (see FIG. 2) of the spindle head 14 is driven and, with the tool unit 20 being in a state of rotation in relation to the spindle head 14, the DC voltage of the power circuit 134 shown in FIG. 9 is converted to high-frequency voltage by the inverter 136 and supplied to the primary power coil 56a. Here, the drive frequency of the inverter 136 is controlled by the control device 140, and the AC voltage of drive frequency $f_d$ obtained above is supplied to the primary power coil 56a.

By so doing, a magnetic flux is generated in the primary power coil 56a that penetrates the primary power coil 56a and changes in accordance with the output frequency. The applied magnetic flux is focused at the pot core 60, and the magnetic flux that exits the pot core 60 is interlinked with the secondary power coil 56b. As a result, the primary power coil 56a and the secondary power coil 56b are electromagnetically coupled, and induced electromotive force is generated in the secondary power coil 56b through mutual induction. In this way, power transmission between relatively rotating the primary power coil 56a and the secondary power coil 56b is possible in a contact-free state, and the high-frequency voltage generated in the secondary power coil 56b is supplied to the ultrasonic transducer 112 as drive power. Accordingly, the ultrasonic transducer 112 is vibrated, the rotation driven by the motor 32 and the vibration of the ultrasonic transducer 112 are superimposed in the tool 18, and processing of the workpiece 24 (see FIG. 1) can be performed with greater precision.

Figure 15A:
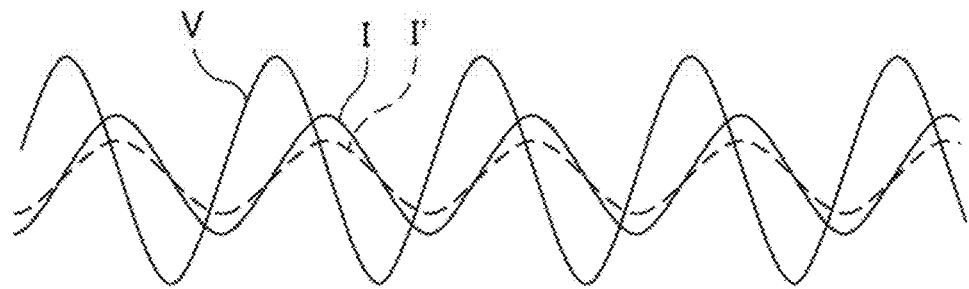
FIGS. 15A and 15B are views that indicate the circumstances of the changes in the voltage and electrical current when the ultrasonic transducer's resonant frequency changes, wherein FIG. 15A indicates when the amplitude of the electrical current changes, and FIG. 15B indicates when the phase of the electrical current changes.
Figure 15B:
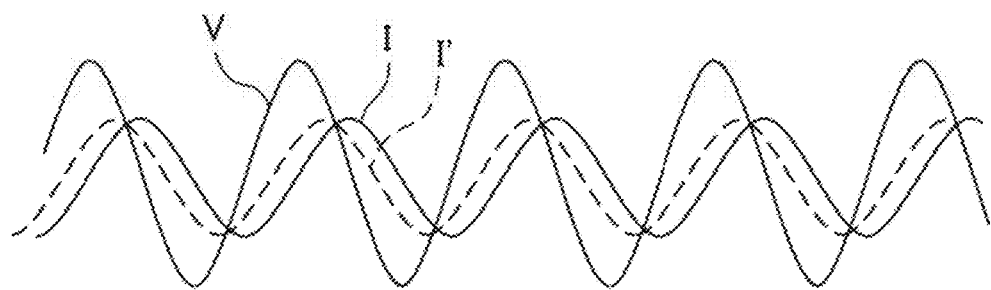

During processing of the workpiece 24, resonant frequency $f_r$ of the ultrasonic transducer 112 is changed in accordance with the changes in the mechanical load applied through the tool 18 and the changes in temperature conditions. Changes in resonant frequency $f_r$ of the ultrasonic transducer 112, for example, appear as the size (amplitude) of the voltage applied to the ultrasonic transducer 112, the size (amplitude) of the electrical current flowing through the ultrasonic transducer 112, and a change in the phase difference between these voltage and electrical current. For example, as indicated as I' in FIG. 15A, when the load increases, the amplitude of the electrical current becomes smaller and, as indicated as I' in FIG. 15B, when the load increases, a phase difference is generated that differs from the phase difference to that point. With the processing apparatus 10 according to this embodiment, feedback control that changes the frequency of the AC voltage applied to the ultrasonic transducer 112 in response to changes in the resonant frequency $f_r$ of the ultrasonic transducer 112 can also be performed.

First, the state of vibration of the ultrasonic transducer 112 is detected by the detection circuit 144 shown in FIG. 9. In the detection circuit 144, for example, a Hall element or the like is provided, and, for example, the amplitude of the voltage applied to the ultrasonic transducer 112, the amplitude of the electrical current flowing through the ultrasonic transducer 112, and the phase of these voltage and electrical current etc. are detected as the state of vibration of the ultrasonic transducer 112.

Detected by the detection circuit 144, the amplitude and phase, etc., of the voltage and electrical current in the ultrasonic transducer 112 is amplified at the amplifier circuit 146 as a detection signal and applied to the tool side signal coil 58b as AC voltage. Due to that, magnetic flux is generated that penetrates the tool side signal coil 58b and changes in accordance with the output frequency, and that magnetic flux is interlinked with the main body side signal coil 58a. As a result, induced electromotive force is generated in the main body side signal coil 58a through the mutual induction with the tool side signal coil 58h, and the detection signal transmitted from the detection circuit 144 is taken from the main body side signal coil 58a by the communication circuit 138. Transmission of the electrical signal between the relatively rotating tool side signal coil 58b and the main body side signal coil 58a in a contact-free state is made possible in this way.

The detection signal taken from the main body side signal coil 58a is input into the control device 140. The control device 140 compares the amplitude of the voltage and the amplitude of the electrical current of the ultrasonic transducer 112, and the phase difference between that voltage and electrical current, etc., which are all obtained from the detection signal, with the conditions prior to receiving the detection signal. When there is a change from those conditions prior to receiving the detection signal, in order to return to the conditions prior to receiving the detection signal, the control device 140 changes the drive frequency of the inverter 136 so as to change the power supply frequency to the primary power coil 56a. The amount of change in the drive frequency of the inverter 136 may be set by first recording in the control device 140, as a table and in advance, the amount of change in the amplitude of the voltage and the electrical current, as well as the amount of change in the drive frequency in accordance with the amount of change in the phase difference, and then searching for the desired setting from that table. Alternatively, for example, adjustment can be made by receiving the amplitude of the voltage and the amplitude of the electrical current of the ultrasonic transducer 112, as well as the phase of the voltage and electrical current, etc., from the detection circuit 144, and then changing the drive frequency of the inverter 136 gradually in 0.1 kHz or 0.5 kHz increments, etc. This way, the AC voltage of drive frequency $f_d$ can be applied to the ultrasonic transducer 112 in accordance with the post-change resonant frequency $f_r$ in order to return to the expected state of vibration shown in FIG. 12. A power supply control member that includes the control device 140 and the inverter 136 is configured in this embodiment in this way.

With the processing apparatus 10 according to this embodiment, drive power can be supplied between the relatively displaced the spindle head 14 and the tool unit 20, from the spindle head 14 to the ultrasonic transducer 112 provided on the tool unit 20. Furthermore, it becomes possible to transmit the state of vibration of the ultrasonic transducer 112 from the tool unit 20 to the spindle head 14 as an electrical signal, enabling feedback control that changes the frequency of the AC voltage applied to the ultrasonic transducer 112 in response to changes in resonant frequency $f_r$ of the ultrasonic transducer 112. As a result, a more stable stroke is ensured for the tool 18, enabling greater processing accuracy to be obtained. Also, if, for some reason, a short circuit or disconnection is generated on that tool unit 20 side, by varying the applied voltage from the resonant frequency through a change in the resonance conditions of the ultrasonic transducer 112, it is possible to prevent large amounts of energy from being supplied to the tool unit 20 side.

Further, with the processing apparatus 10 in this embodiment, the first winding portion 68 and the second winding portion 70, wound in mutually opposite directions, are provided in each of the main body side signal coil 58a and the tool side signal coil 58b. With this arrangement, the induced noise electromotive force to the main body side signal coil 58a and the tool side signal coil 58b that comes from the magnetic flux generated by supplying power to the primary power coil 56a can be reduced, and transmission of the electrical signal can thus be performed with greater accuracy.

Figure 16A:
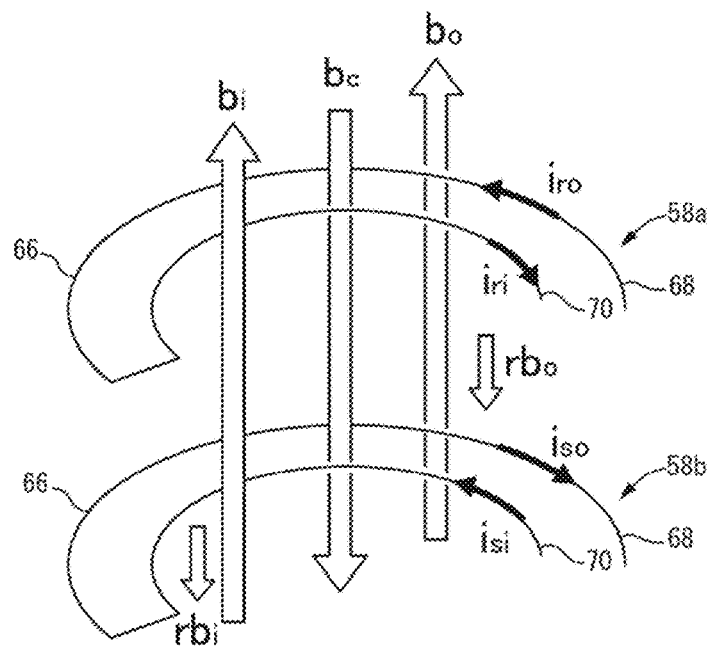
FIGS. 16A and 16B are views that indicate the direction of the induced current generated in the signal coil, wherein FIG. 16A indicates at the time of electrical signal transmission, and FIG. 16B indicates at the time of noise generation.
Figure 17A:
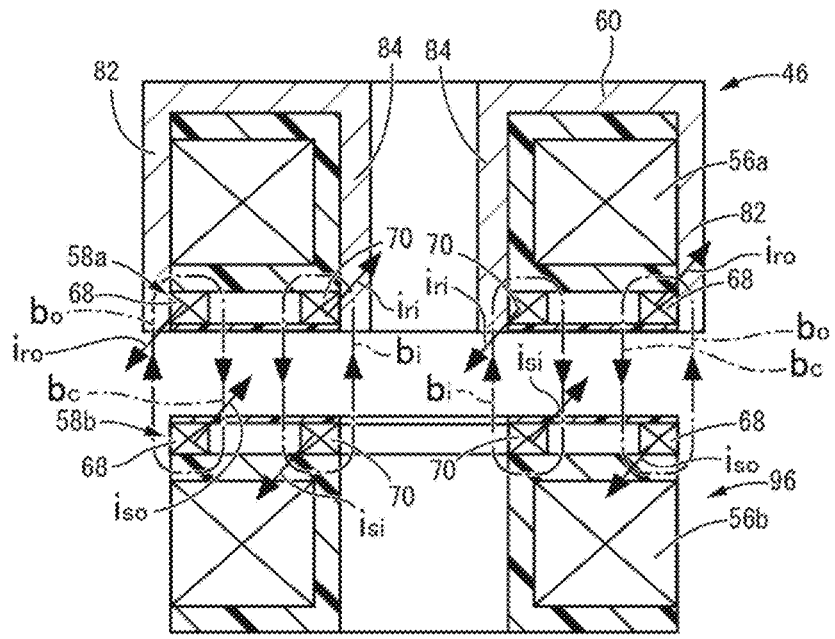
FIGS. 17A and 17B are longitudinal cross sectional views that indicate the direction of the induced current generated in the signal coil, wherein FIG. 17A indicates at the time of electrical signal transmission, and FIG. 17B indicates at the time of noise generation.
Figure 17B:
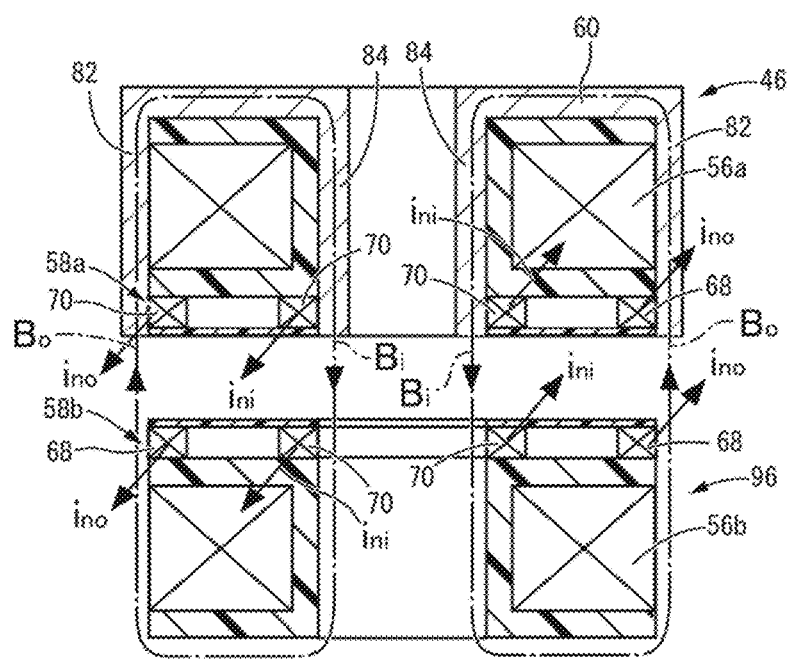

In other words, as shown in model forms in FIG. 16A and FIG. 17A, when transmitting an electrical signal from the tool side signal coil 58b to the main body side signal coil 58a, by first applying AC voltage to the tool side signal coil 58b, electrical current $i_{so}$ flows to the first winding portion 68 of the tool side signal coil 58b and electrical current $i_{si}$ flows to the second winding portion 70. FIGS. 17A and 17B show the electrical currents that flow to the near side of the paper surface as arrows that extend diagonally downward, and the electrical currents that flow to the back side of the paper surface as arrows that extend diagonally upward. These, electrical current $i_{so}$ and electrical current $i_{si}$, are the same electrical current and both flow in the same direction in the lead wire 66 of the tool side signal coil 58b. Furthermore, due to electrical current $i_{so}$ and electrical current $i_{si}$ flowing to the tool side signal coil 58b, magnetic flux $b_i$ is generated on the inside of the second winding portion 70, magnetic flux $b_c$ is generated between the second winding portion 70 and the first winding portion 68, and magnetic flux $b_o$ is generated on the outside of the first winding portion 68. Here, the first winding portion 68 and the second winding portion 70 are wound in mutually opposite directions, so, when viewing from the exterior of the lead wire 66, the flows of electrical current $i_{so}$ and electrical current $i_{si}$ are mutually reversed. As a result, the lines of magnetic force of magnetic flux $b_i$ and magnetic flux $b_o$ move in the same direction, while the line of magnetic force of magnetic flux $b_c$ moves in the opposite direction to the lines of magnetic force of magnetic flux $b_i$ and magnetic flux $b_o$.

Here, magnetic flux $rb_o$, flowing in the opposite direction to magnetic flux $b_o$, is generated by electrical current $i_{si}$ flowing through the second winding portion 70 on the outside of the first winding portion 68. Meanwhile, magnetic flux $rb_i$, flowing in the opposite direction to magnetic flux $b_i$, is generated by electrical current $i_{so}$ flowing through the first winding portion 68 on the inside of the second winding portion 70. However, because the first winding portion 68 and the second winding portion 70 are positioned apart, and there is some distance from the second winding portion 70 to the outside of the first winding portion 68 and from the first winding portion 68 to the inside of the second winding portion 70, magnetic fluxes $rb_o$ and $rb_i$ affect magnetic flux $b_o$ and $b_i$ to such a small degree as to be almost inconsequential.

Also, due to the magnetic fluxes $b_i$, $b_c$ and $b_o$ generated by the tool side signal coil 58b, induced current $i_{ro}$ is generated at the first winding portion 68 of the opposing main body side signal coil 58a and induced current $i_{ri}$ is generated at the second winding portion 70. These induced currents $i_{ro}$ and $i_{ri}$ both flow in the same direction in the lead wire 66 of the main body side signal coil 58a and do not offset each other. An electrical current can be transmitted from the tool side signal coil 58b to the main body side signal coil 58a in this way. Especially in this embodiment, because the main body side signal coil 58a is included in the pot core 60, the first winding portion 68 is arranged close to the external wall 82 of the pot core 60, and the second winding portion 70 is arranged close to the internal wall 84. Thus, induced currents $i_{ro}$ and $i_{ri}$, which both flow in the same direction in the lead wire 66, can be effectively generated respectively in the first winding portion 68 and the second winding portion 70 by focusing magnetic flux $b_i$ and $b_o$ respectively at the external wall 82 and the internal wall 84.

Figure 16B:
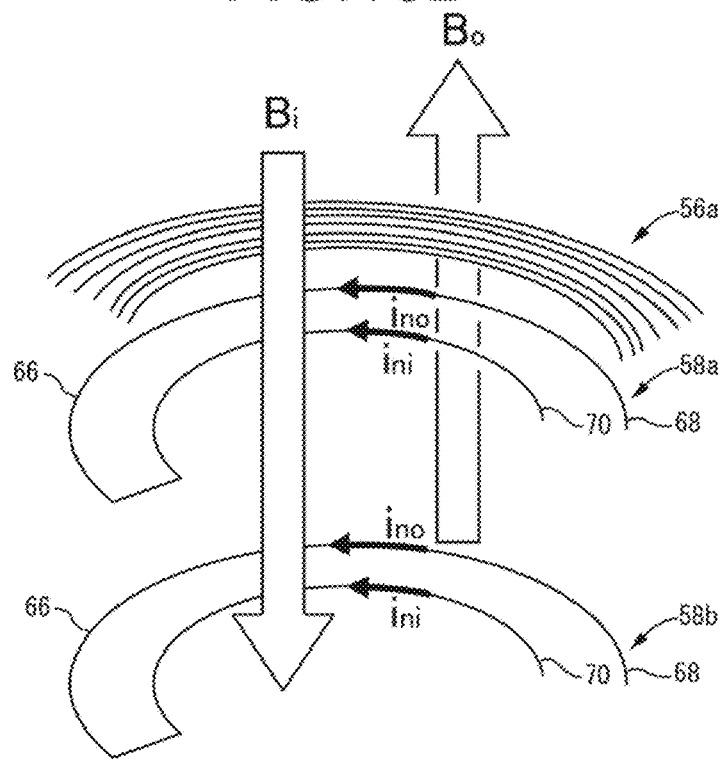

On the other hand, as shown in model form in FIG. 16B and FIG. 17B, if AC voltage is applied to the primary power coil 56a, magnetic flux $B_i$ is generated inside the primary power coil 56a and magnetic flux $B_o$ is generated outside. The direction of the line of magnetic force of magnetic flux $B_i$ and the direction of the line of magnetic force of magnetic flux $B_o$ are mutually opposed. These magnetic fluxes $B_i$ and $B_o$ pass through the inside of the second winding portion 70 and the outside of the first winding portion 68 respectively in each of the main body side signal coil 58a and the tool side signal coil 58b. Due to this, and using the main body side signal coil 58a as an example for explanation, induced current $i_{no}$, which becomes noise current, is generated in the first winding portion 68, and induced current $i_{ni}$, which becomes noise current, is generated in the second winding portion 70. Because magnetic flux $B_i$ and magnetic flux $B_o$ move in mutually opposite directions, sandwiching both sides of the first winding portion 68 and the second winding portion 70, induced current $i_{no}$ and induced current $i_{ni}$ both flow in the same direction when viewing from the exterior of the lead wire 66 of the main body side signal coil 58a. And, because the first winding portion 68 and the second winding portion 70 are wound in mutually opposite directions, induced current $i_{no}$ and induced current $i_{ni}$ are electrical currents of mutually opposite directions within the lead wire 66, and mutually reverse electromotive forces are generated in relation to the common magnetic field in the first winding portion 68 and the second winding portion 70. As a result, induced current $i_{no}$ and induced current $i_{ni}$ cancel each other out, and, by changing the size and number of winds on the first winding portion 68 and the second winding portion 70 so that the size of induced current $i_{no}$ and induced current $i_{ni}$ are as close as possible, it is possible to offset the electromotive forces that become noise and that are generated in the main body side signal coil 58a due to the effect of magnetic fluxes $B_i$ and $B_o$ generated by the primary power coil 56a. It is thus possible to transmit the electrical signal while reducing the noise caused by the effect of the primary power coil 56a in this way.

Here, as shown in both FIG. 16B and FIG. 17B, it is possible to similarly reduce noise electromotive force in the tool side signal coil 58b as well, and, in this embodiment, noise can be reduced in both the electrical signal's transmission side (the tool side signal coil 58b) and reception side (the main body side signal coil 58a). It is also possible to improve the transmission quality of the electrical signal by adopting a specific coil winding path like that described above for each of the main body side signal coil 58a and the tool side signal coil 58b, in an extremely simple configuration and without separately providing any special control device or noise suppression coil material. Furthermore, because using a specially configured coil winding path produces offsetting electromotive forces of opposite directions, even when the amount of magnetic flux that affects the main body side signal coil 58a and the tool side signal coil 58b changes, it is possible to automatically counter the changes in the amount of magnetic flux without the need for retuning and the like, and an outstanding noise suppression effect can be achieved.

And, since the effect from the primary power coil 56a can be offset, it becomes possible to locate the main body side signal coil 58a in a position extremely close to the primary power coil 56a. In this embodiment, the main body side signal coil 58a is seated together with the primary power coil 56a in the same circular groove 80 in the pot core 60. This way, mutual lead wires 62 and 66 can also be arranged in an overlapping manner, which was conventionally difficult due to the mutual interference of their magnetic paths, so that enlargement and complexity of the core components can be avoided, and outstanding space efficiency can be achieved. Also, by seating the main body side signal coil 58a inside the pot core 60, it is possible, for example, to protect the main body side signal coil 58a from the disturbance caused by magnetism from the motor 32, etc.

Furthermore, in the processing apparatus 10, which is structured in accordance with this embodiment, the pot core 60 is situated only on the spindle head 14 side; it is not situated on the tool unit 20 side where the ultrasonic transducer 112 is located. From this, an increase in the inductance of the resonant circuit in the ultrasonic transducer 112 can be avoided, and a decrease in the resonant frequency of the ultrasonic transducer 112 can be avoided as well. As a result, the ultrasonic transducer 112 can be driven at a high frequency, and greater processing accuracy can be attained. Furthermore, by preventing large changes in the resonant frequency of the ultrasonic transducer 112, that resonant frequency of the ultrasonic transducer 112 can be easily brought in line with the mechanically unique vibration frequency of the tool unit 20, which includes the horn 114 and the tool 18. Tuning thus becomes easy and the effective stroke of the tool 18 can be obtained.

Figure 18:
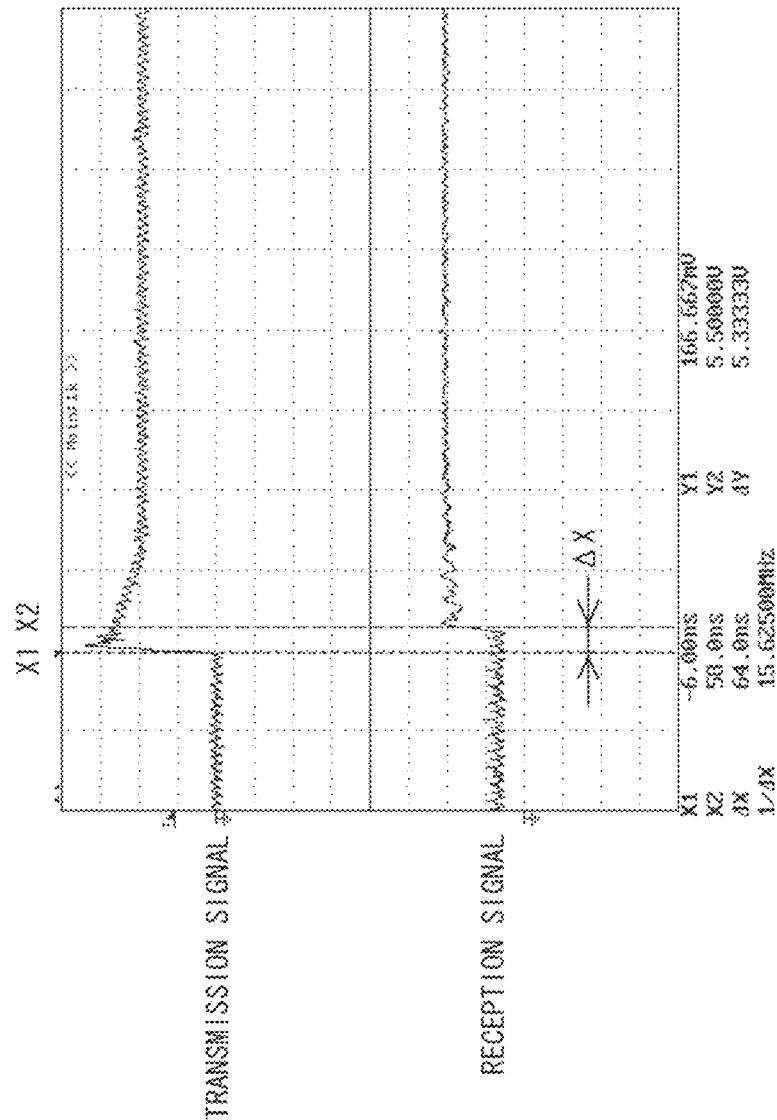
FIG. 18 is a graph that measures the transmission timing of the detection signal on the tool side and the reception timing of the detection signal on the main body side.

In addition, because, by adopting a specific coil winding path for the main body side signal coil 58a and the tool side signal coil 58b, noise electromotive force can be reduced through the very structure of the main body side signal coil 58a and the tool side signal coil 58b, the detection signal transmitted from the tool unit 20 side can be quickly reproduced at the equipment main body 12 side without the need for a special noise eliminating means. Furthermore, the timing at which noise electromotive force is generated in the main body side signal coil 58a and the tool side signal coil 58b can be precisely controlled through the timing at which power is supplied to the primary power coil 56a and the secondary power coil 56b. Thus, the real-time quality of the signal transfer from the tool unit 20 to the equipment main body 12 can be improved, and feedback control can be performed with better responsiveness. FIG. 18 shows the measured results of the transmission timing of the detection signal at the tool unit 20 side ("Transmission Signal" in the drawing) and the reception timing at the equipment main body 12 side ("Reception Signal" in the drawing). As indicated as ΔX at the bottom of the graph in FIG. 18, the time required for signal transfer from time X1, when the detection signal at the tool unit 20 side was transmitted, to time X2, when the detection signal was received at the equipment main body 12 side, is 64.0 ns, thus confirming that an extremely rapid signal transfer is possible.

Figure 27:
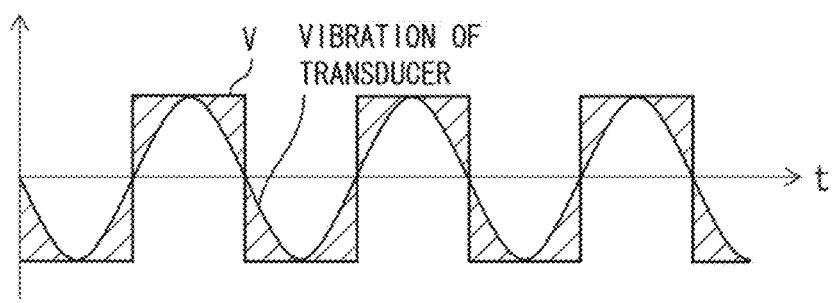
FIG. 27 is a view suitable for explaining the voltage applied to the ultrasonic transducer and the state of vibration of the ultrasonic transducer.

Furthermore, by not providing the pot core 60 on the tool unit 20 side, like, for example, in the case that the core components are installed on both the spindle head 14 and the tool unit 20, there is no focusing of the magnetic flux from the primary power coil 56a between opposing surfaces of the core components. This can avoid a sudden drop in the interlink magnetic flux of the secondary power coil 56b due to only a slight shift of the tool unit 20 in relation to the spindle head 14 and stable power transmission can be carried out. Also, by aggressively generating leakage flux between the primary power coil 56a and the secondary power coil 56b, as shown in FIG. 27, for example, the AC voltage received at the secondary power coil 56b side can be brought closer to the sine wave of the mechanical vibration of the ultrasonic transducer 112 when AC power is transmitted from the primary power coil 56a as a square wave. As a result, the drive of the ultrasonic transducer 112 can be manifested more stably, the deviations in the ultrasonic transducer 112 can be minimized, and greater processing accuracy can be obtained. It is also possible to reduce the generation of heat caused by surplus power. In addition, by not installing a core component on the tool unit 20 side, the weight of the tool unit 20 can be lightened for faster rotation, and problems such as damage to the core component at high-speed rotation can be avoided.

Figure 19:
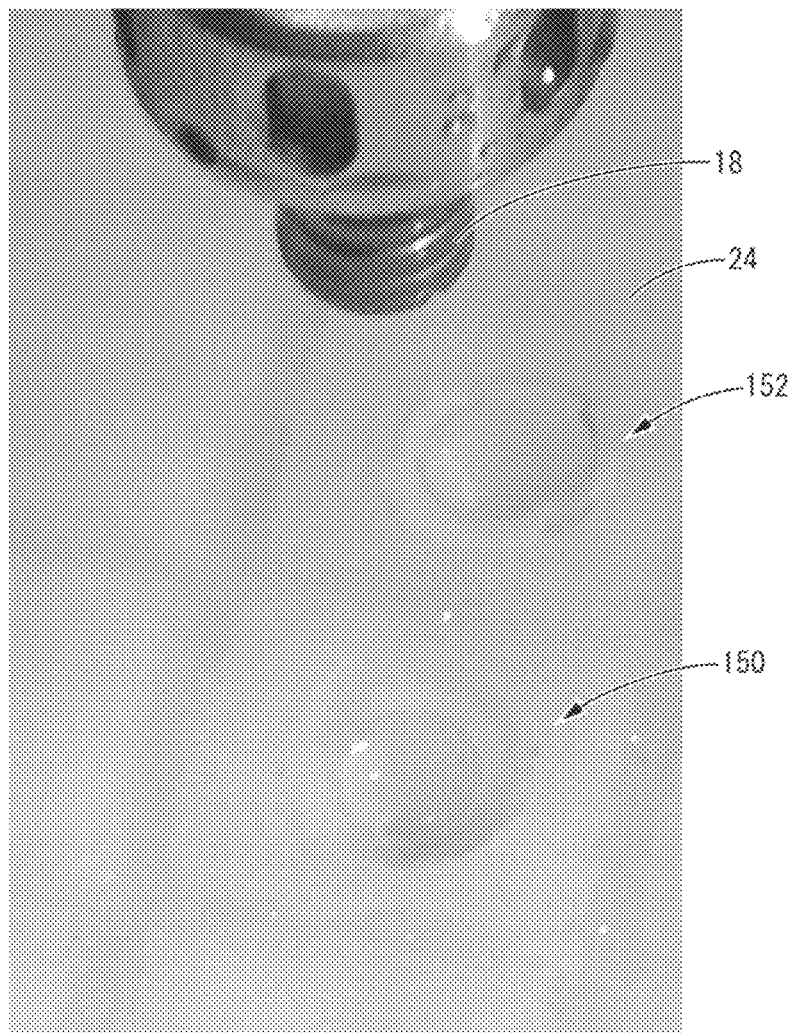
FIG. 19 is a photograph that shows both the hole fanned when the tool is vibrated and rotated and the hole formed when the tool is rotated without vibration.

Here, FIG. 19 shows when the present invention was employed in the head portion of an NC lathe and shows both a hole 150, which formed in the workpiece 24 when the tool 18 was vibrated and rotated, and, as a comparative example, a hole 152, which formed when the tool 18 was rotated without vibration. Both cases were carried out under the same conditions: the workpiece 24 was a glass plate, the tool 18 was an endmill with a blade diameter of ø10 mm, the drilling time was approximately 20 sec, rotation was 5000 rpm, and, when the tool 18 was vibrated, vibration was performed with a specific vibration stroke of a few nm to a few As shown in FIG. 19, when the tool 18 was vibrated and rotated, the workpiece 24 did not crack and the smooth hole 150 was formed. On the other hand, when the tool 18 rotated without vibration to form the hole 152, the workpiece 24 cracked and a smooth hole could not be formed.

Figure 20:
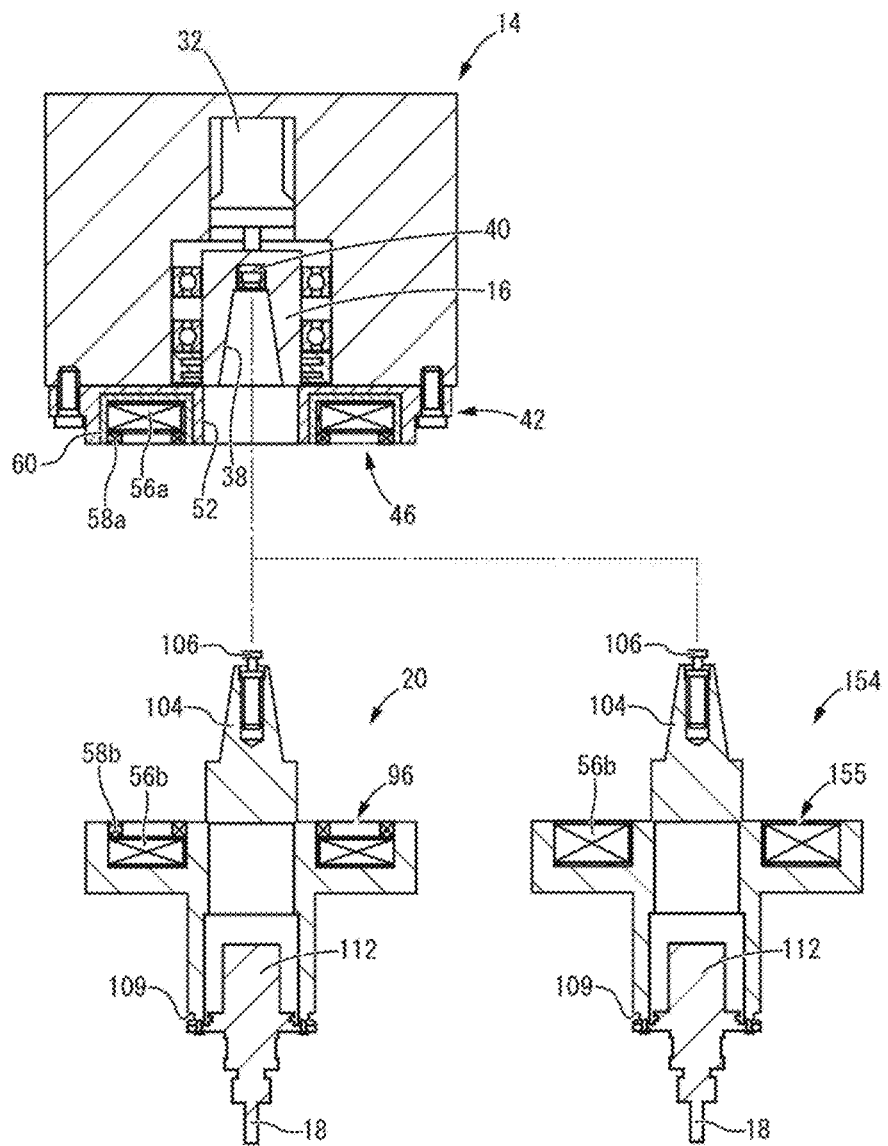
FIG. 20 is a view that displays the multiple tool units of the processing apparatus shown in FIG. 1.

Further, as shown in model form in FIG. 20, the processing apparatus 10 according to this embodiment can be equipped with multiple tool units 20 and 154 (shown as two in FIG. 20), and those multiple tool units 20 and 154 can be selectively attached to the spindle head 14, for example, using an ATC (not shown in the drawing) or manually. Hereafter, for the structure of the tool unit 154 that is similar to the tool unit 20, the same numbering has been used in the drawing and a separate explanation has been omitted.

The tool unit 154 corresponds to the tool unit 20 with the tool side signal coil 58b removed from the tool side coil head 96. That is to say, a tool side coil head 155 on the tool unit 154 is equipped only with the secondary power coil 56b, and the secondary power coil 56b is connected to the ultrasonic transducer 112. Also, the detection circuit 144 and the amplifier circuit 146 (see FIG. 9), which are on the tool unit 20, are not included with the tool unit 154. Therefore, when the tool unit 154 is installed on the spindle head 14, the main body side signal coil 58a is not used and the ultrasonic transducer 112 is driven at the specified frequency by, for example, transmitting the AC voltage of frequency preset in the control device 140 to the tool unit 154. Furthermore, the tool 18 on the tool unit 154 may be different than the tool 18 on the tool unit 20, or it may be the same.

By doing this, various processing can be accomplished by preparing multiple tool units equipped with different types of tools. For example, the tool unit 20 can be used when it is desirable to detect the state of vibration of the tool 18 and perform feedback control, or the tool unit 154 can be used when feedback control is not necessary.

Figure 21:
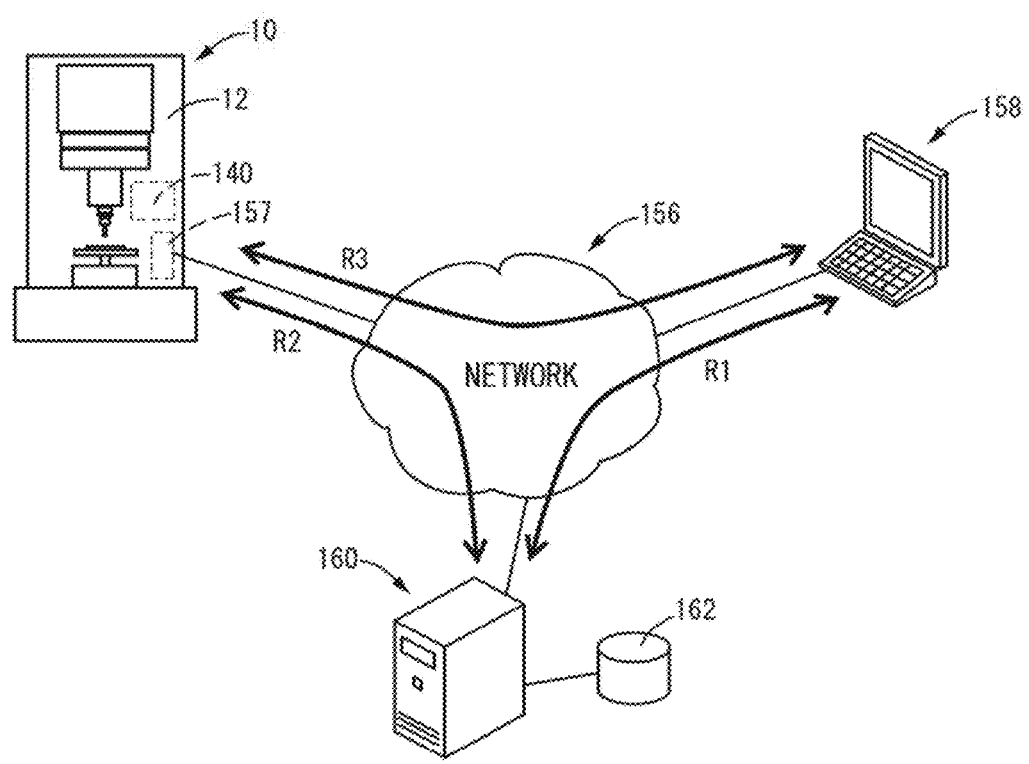
FIG. 21 is a view suitable for explaining an embodiment of the connection of the processing apparatus shown in FIG. 1 to a computer network.

Furthermore, as shown in model form in FIG. 21, the processing apparatus 10 according to this embodiment can be operated remotely by connecting with a computer network 156, such as a LAN, WAN, or the Internet. For example, by connecting a network interface 157 to the control device 140 provided on the equipment main body 12, the control device 140 can be connected to the computer network 156 via the network interface 157. A client 158 and a server 160 composed of computers are also connected to the computer network 156.

As shown by arrow $R_1$ in FIG. 21, the client 158 is connected to the server 160 via the computer network 156 and, as shown by arrow $R_2$, the processing apparatus 10 is connected as a client to the server 160. Thus, the client 158 and the processing apparatus 10 are connected to each other through the server 160 and, by installing a routing device that buffers bidirectional data packets at the server 160 and transmits them reciprocally to the client 158 and the processing apparatus 10, it is possible to use the client 158 to remotely operate the processing apparatus 10, which is on a network environment isolated by a firewall, and the vibration characteristics of the ultrasonic transducer 112 on the processing apparatus 10 can then be remotely monitored at the client 158. Further, it is also possible to provide a database 162 on the server 160, in which the vibration characteristics of the ultrasonic transducer 112 on the processing apparatus 10 and the operating conditions of the processing apparatus 10 are memorized. This allows the database 162 on the server 160 accessible from the processing apparatus 10 in order to set operating conditions, or accessible from the client 158 in order to control the operation of the processing apparatus 10 in accordance with the obtained vibration characteristics and operating conditions. A control program installed in the control device 140 on the processing apparatus 10 can also be updated remotely from the client 158 and the server 160 over the computer network 156. Also, as shown in arrow $R_3$ in FIG. 21, for example, by providing a server function in the control device 140 itself on the processing apparatus 10, the client 158 can be connected directly to the processing apparatus 10 without going through the server 160.

One embodiment of the present invention is described in detail above, but concrete embodiments of the present invention are not limited to that above. Hereafter, some different embodiments for the present invention are shown, but these are ultimately exemplifications and do not indicate that the present invention is limited to the following concrete embodiments. Also, for those components and parts of the following embodiments that are equivalent to the first embodiment above, the same numbering has been used in the drawing and separate explanations have been omitted.

Figure 22:
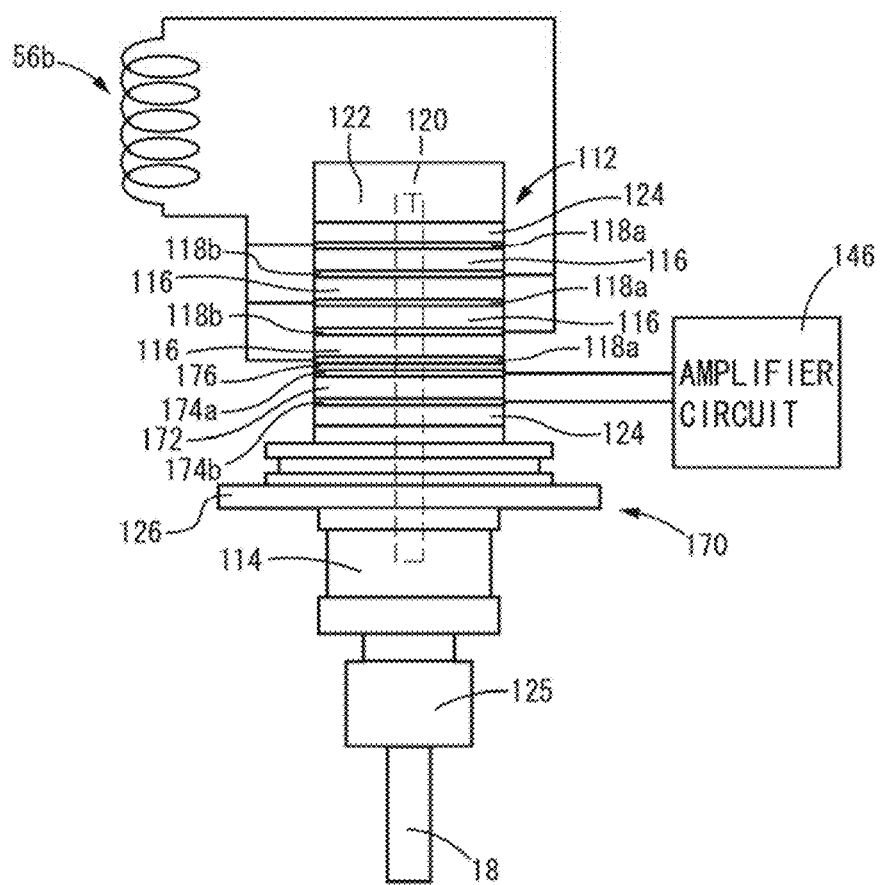
FIG. 22 is a view that shows a detection member of a processing apparatus according to a second embodiment of the present invention.

First of all, FIG. 22 shows a vibration unit 170 in model form equipped with the detection member used in the processing apparatus according to a second embodiment the present invention. In this embodiment, the multiple piezoelectric elements 116 that make up the ultrasonic transducer 112 are provided along with a piezoelectric element 172 as the detection member. The piezoelectric element 172, functioning as the detection member, is sandwiched between electrodes 174a and 174b and these electrodes 174a and 174b are connected to the amplifier circuit 146 (see FIG. 9). This piezoelectric element 172 as the detection member is, similarly to the multiple piezoelectric elements 116 that compose the ultrasonic transducer 112, externally fitted onto the bolt 120, fastened with the metal block 122 and the horn 114, which are screwed onto both sides of the bolt 120, and layered together with the piezoelectric elements 116 that compose the ultrasonic transducer 112. An insulation 176 intervenes between the adjacent electrode 118a of piezoelectric element 116 and the electrodes 174a of the piezoelectric element 172, which is the detection member, and they are mutually insulated.

With this kind of structure, when the ultrasonic transducer 112 is driven, the vibration of the ultrasonic transducer 112 is transferred to the piezoelectric element 172, the detection member, and voltage is generated in the piezoelectric element 172. By supplying this voltage that is generated in the piezoelectric element 172 from the electrodes 174a and 174b through the amplifier circuit 146 to the tool side signal coil 58b and transmitting it to the main body side signal coil 58a, the state of vibration of the ultrasonic transducer 112 can be detected by the control device 140 on the main body side as a change in voltage. Further, with this embodiment, the detection member can be realized with a simple structure. In addition to that, because the detection member can be coaxially installed within the ultrasonic transducer 112, the detection member can be provided via an efficient use of space and, by suppressing deviations in the tool side's weight balance, the rotational drive of the tool side can be performed more stably.

Figure 23:
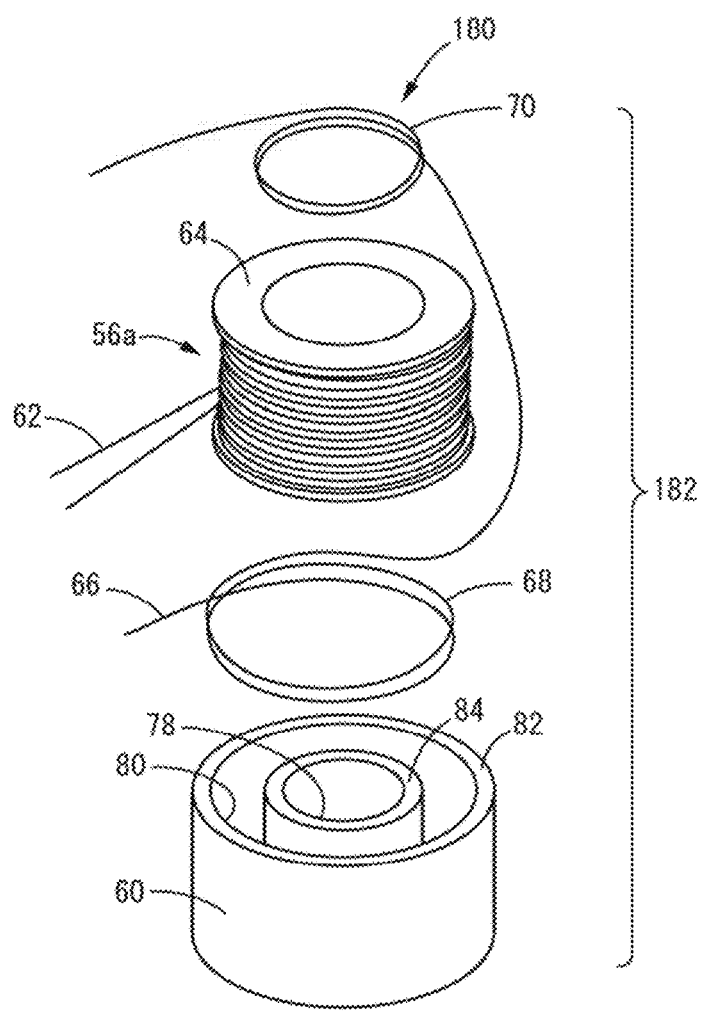
FIG. 23 is an exploded perspective view that shows a primary power coil, a signal coil and a pot core of a processing apparatus according to a third embodiment of the present invention.

Next, FIG. 23 shows a disassembled main body side coil head 182, equipped with the primary power coil 56a and a signal coil 180, that are part of the processing apparatus according to a third embodiment of the present invention. With the signal coil 180, after winding the lead wire 66 circularly to form the first winding portion 68, the lead wire 66 is extended out from the first winding portion 68, and the second winding portion 70 is formed by winding in the opposite direction from the first winding portion 68. Further, the first winding portion 68 is first seated in the circular groove 80 of the pot core 60, and, after that, the primary power coil 56a and the second winding portion 70 are seated, in that order. The first winding portion 68 and the second winding portion 70 are thus arranged, sandwiching the primary power coil 56a on both sides in the axial direction.

As in this embodiment, it is possible to form the first winding portion 68 and the second winding portion 70 for the signal coil 180 on different planes. By doing so, a large area for forming the first winding portion 68 and a large area for forming the second winding portion 70 can be separately secured, and thus the level of freedom in setting the number of winds for the first winding portion 68 and the second winding portion 70 can be improved. This configuration can also be applied to the tool side coil head 96 (see FIG. 5, etc.), and, in that case, the first winding portion 68 and the second winding portion 70 of the signal coil 180 can be arranged sandwiching the secondary power coil 56b on both sides without using the pot core 60. Also, in this embodiment, the signal coil 180 may be used on both the main body side and the tool side, or used only on one of those sides, with the other side adopting a signal coil having different configuration such as the one mentioned in the first embodiment above.

Figure 24:
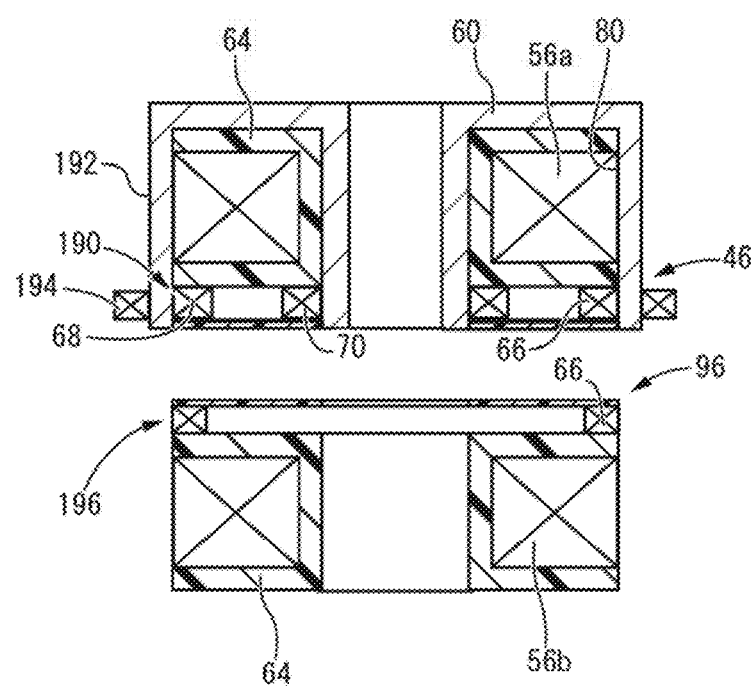
FIG. 24 is a longitudinal cross sectional view of a primary power coil, a secondary power coil, signal coils and a pot core of a processing apparatus according to a fourth embodiment of the present invention.

Next, FIG. 24 shows a signal coil 190, which is part of the processing apparatus according to a fourth embodiment of the present invention. The signal coil 190 is installed on the main body side coil head 46, and the lead wire 66, which is seated in the circular groove 80 of the pot core 60, extends out to the exterior of the pot core 60 and is wound around a circumference surface 192 of the pot core 60. A circumferential winding portion 194 is formed by the lead wire 66 wound on the circumference surface 192. The winding direction of the circumferential winding portion 194 is set in the same direction as either the first winding portion 68 or the second winding portion 70.

In this embodiment, a coil winding path that generates mutually reverse electromotive forces is formed by the first winding portion 68, the second winding portion 70, and the circumferential winding portion 194. Through this, it is possible to adjust the noise reduction effect more precisely. It is also possible to form a coil winding path in which mutually reverse electromotive forces are generated by the circumferential winding portion 194 and either the first winding portion 68 or the second winding portion 70. Also, in this embodiment, a signal coil 196 of the tool side coil head 96 is wound in only one direction and given the annular-shape that is conventionally in wide use. In this way, a coil winding path that generates mutually reverse electromotive forces can be formed on at least one of the signal coils on the main body side or the tool side.

Figure 25:
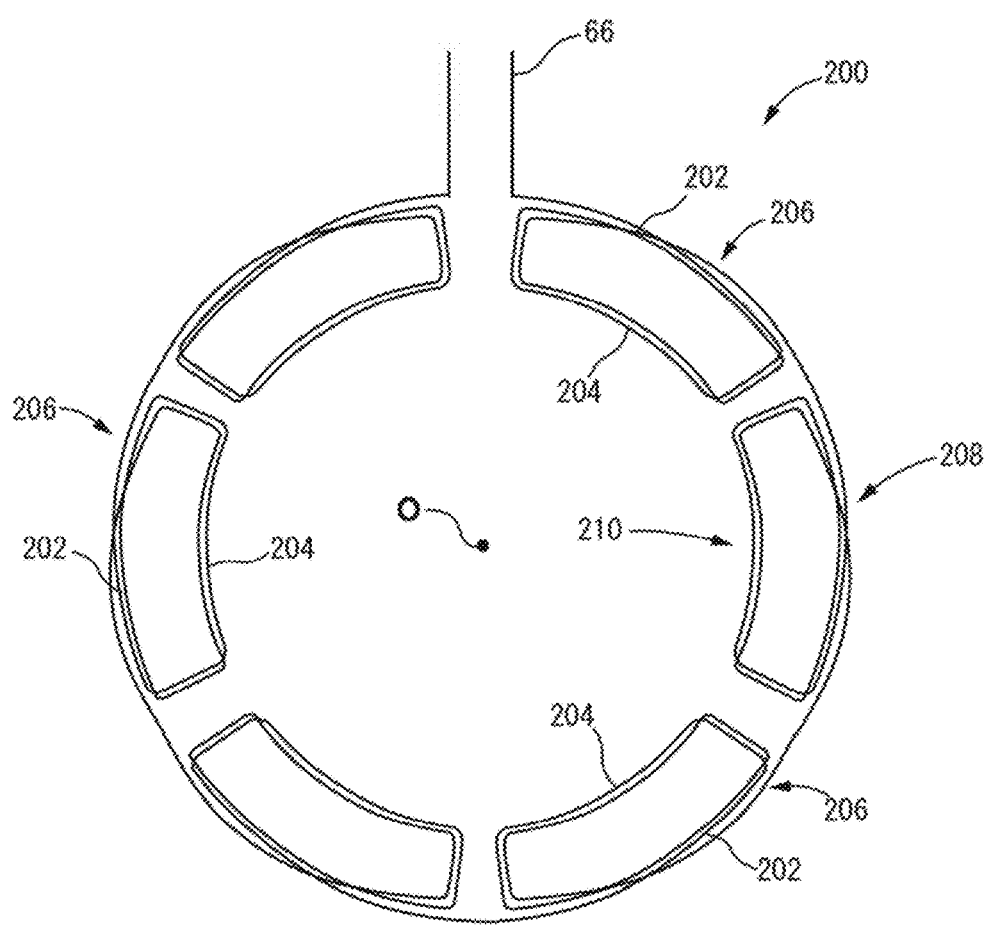
FIG. 25 is a front view that shows in model form a signal coil of a processing apparatus according to a fifth embodiment of the present invention.
Figure 26:
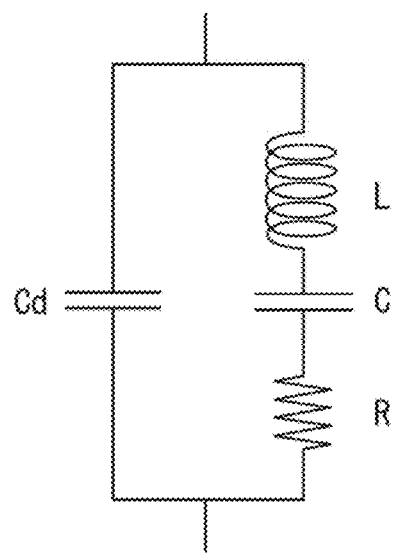
FIG. 26 is a view suitable for explaining the ultrasonic transducer.

FIG. 25 shows a signal coil 200 in model form, which is part of the processing apparatus according to a fifth embodiment of the present invention. With the signal coil 200, an outer winding portion 202 is formed by extending the lead wire 66 circumferentially, in radially outside, less than one circle (approx. ⅙ of a circle in this embodiment) and turning it back from the outer winding portion 202. An inner winding portion 204 is formed by extending the lead wire 66 circumferentially in the opposite direction from the outer winding portion 202, in radially inside, approximately the same length circumferentially as the outer winding portion 202 (approx. ⅙ of a circle in this embodiment). A small loop portion 206 is formed by this outer winding portion 202 and the inner winding portion 204. This kind of small loop portion 206 is created repeatedly to form multiple small loop portions 206 circumferentially and in sequence. Also, the number of winds in each small loop portion 206 can be set as desired. Thus, the outer winding portions 202 of the respective small loop portions 206 are formed on approximately the same circumference, and a first winding portion 208 is formed by these multiple outer winding portions 202. The inner winding portions 204 of the respective small loop portions 206 are formed on approximately the same circumference on the inside of the outer winding portions 202, and a second winding portion 210 is formed by the multiple inner winding portions 204.

Even with this kind of winding path, the outer winding portions 202 and the inner winding portions 204 are wound in mutually opposite directions (the outer winding portion 202: clockwise, the inner winding portion 204: counterclockwise in FIG. 25) around center o of the primary power coil and the secondary power coil (neither shown in the drawing), which are arranged on the concentric axis with the signal coil 200. Thus, the first winding portion 208 and the second winding portion 210 wound in mutually opposite directions can be formed by the multiple outer winding portions 202 and the multiple inner winding portions 204. And, since, with this embodiment, the number of winds for each small loop portion 206 can be changed, for example, in accordance with a variance in the amount of local magnetic flux change that occurs circumferentially in the signal coil 200, the noise electromotive force reduction effect can be adjusted more precisely. Further, the form-stability of the signal coil 200 can be heightened by making multiple circularly-shaped small loop portions 206 that extend partially around in a circumferential direction.

Embodiments of the present invention are described in detail above, but these are ultimately exemplifications, and the concrete description of those embodiments should not be construed as limiting the present invention in any way.

For example, with each of the embodiments above, the core component is provided only on the main body side, but, in cases such as when it is desirable to enlarge the gap between the main body side and the tool side, namely, to adjust the interlink magnetic flux of the signal coil, the core component can be included on the tool side's signal coil, etc. In such a case, it is preferable to arrange the core component without an exterior encompassing the tool side's secondary power coil, thus avoiding an increase in the secondary power coil's inductance while also being able to include the tool side's signal coil in that core component.

Also, various types of embodiments can be suitably adopted as concrete means to control the power supply frequency to the primary power coil in response to changes in the resonant frequency of the tool side's ultrasonic transducer, without being limited to arithmetic processing with a CPU. For example, a feedback means using a Phase Locked Loop (PLL) can be adopted. Also, the detection targets for detecting changes in the ultrasonic transducer's resonant frequency do not need to be limited to voltage and electrical current, etc., as in the embodiments above; the surrounding ambient temperature, or the ultrasonic transducer's mechanical amplitude or distortion, for example, can also be adopted. Therefore, a thermometer, accelerometer or the like can be used as detection member to detect the ultrasonic transducer's state of vibration.

Furthermore, the winding shape of the power coil and signal coil can also be made, for example, rectangular or elliptical without limiting them to being circular. In addition, in the signal coil, the concrete form of the coil winding path that generates mutually reverse electromotive forces is not limited to those forms in the above embodiments.

Also, in the first embodiment above, the electrical signal is transmitted from the tool side's signal coil to the main body side's signal coil, but it is naturally possible to use these signal coils to transmit the electrical signal conversely from the main body side to the tool side. For example, multiple detection members can also be provided on the tool side to detect the ultrasonic transducer's state of vibration and have an electrical signal that specifies which of those multiple detection members to use transmitted from the main body side to the tool side, while also transmitting the results of the specified detection member from the tool side to the main body side as an electric signal, etc. In such a case, for example, it is possible to detect the switching timing of the inverter that transmits power from the primary power coil to the secondary power coil in order to control the timing of transmission of the electrical signal in accordance with that switching timing, i.e., the timing of applying voltage to the signal coil. Also, by using half-duplex serial communication, the pair of signal coils on the main body side and the tool side can be used to both transmit an electrical signal from the main body side to the tool side and conversely transmit an electrical signal from the tool side to the main body side.

In addition, modulation methods used to transmit the electrical signal with a pair of signal coils are not limited at all; various modulation methods can be adopted, for example, analog modulation like amplitude modulation (AM), frequency modulation (FM) and phase modulation (PM), digital modulation like phase-shift keying (PSK), binary phase-shift keying (Manchester encoding, BPSK), and frequency-shift keying (FSK), and pulse modulation like pulse width modulation (PWM).

In addition, without particularly listing each one, the present invention can be implemented in embodiments to which a variety changes, revisions, improvements, etc., are applied based on the knowledge of the corresponding expert. And, as long as such an embodiment does not deviate from the purport of the present invention, they are all naturally contained within the scope of the present invention.

KEYS TO SYMBOLS

10: processing apparatus, 12: equipment main body, 14: spindle head, 18: tool, 20: tool unit, 24: workpiece, 36: labyrinth seal, 42: main body side transmission unit, 46: main body side coil head, 56a: primary power coil, 56b: secondary power coil, 58a: main body side signal coil, 58b: tool side signal coil, 60: pot core, 68: first winding portion, 70: second winding portion, 94: vibration unit, 96: tool side coil head, 112: ultrasonic transducer, 114: horn, 116: piezoelectric element, 120: bolt, 124: insulating layer, 125: chuck mechanism, 132: airflow path, 172: piezoelectric element (detection member), 176: insulation

The invention claimed is:

1. A processing apparatus comprising:
a main body side equipped with a power supply unit that outputs AC voltage;
a tool side rotatable in relation to the main body side and equipped with an ultrasonic transducer to which a tool is connected;
a pair of a primary power coil and a secondary power coil, which are disposed between the main body side and the tool side on a concentric axis with a rotating central axis of the tool side, wherein a drive power is supplied via the primary and secondary power coils from the power supply unit on the main body side to the ultrasonic transducer on the tool side, being characterized in that:
a pair of signal coils are disposed between the main body side and the tool side such that the signal coils are located on a concentric axis with the power coils and stacked in an axial direction, respectively on the main body side and the tool side,
a detection member is provided on the tool side for detecting a state of vibration of the ultrasonic transducer, and a detection signal from the detection member is transmittable via the signal coils from the tool side to the main body side,
a power supply control member is provided on the main body side for controlling a power supply frequency to the primary power coil based on the detection signal from the detection member, and
at least one of the signal coils on the main body side and the tool side, is provided with a coil winding path that generates mutually reverse electromotive forces in order to offset the electromotive forces generated in that signal coil due to an effect of a magnetic flux produced by the power coils.

2. The processing apparatus according to claim 1, wherein the coil winding path, which generates mutually reverse electromotive forces, includes a first winding portion and a second winding portion that are wound in mutually opposite directions.

3. The processing apparatus according to claim 2, wherein the first winding portion and the second winding portion, which is turned back from the first winding portion and wound conversely along the first winding portion, are formed on a same plane.

4. The processing apparatus according to claim 1, wherein a pot core, which is made from a permeable-magnetic material and has a groove extending circumferentially, is provided on at least one of the main body side and the tool side, and both of the power coils and signal coils are housed in the groove.

5. The processing apparatus according to claim 4, wherein the pot core is provided solely on the main body side.

6. The processing apparatus according to claim 2,
wherein a pot core, which is made from a permeable-magnetic material and has a groove extending circumferentially, is provided on at least one of the main body side and the tool side, and both of the power coils an signal coils are housed in the groove, and
wherein a distance of separation between the first winding portion and the second winding portion is greater than a distance of separation to walls of the groove from both sides of the signal coil.

7. The processing apparatus according to claim 1, wherein the ultrasonic transducer is a Langevin transducer with multiple piezoelectric elements layered, and the detection member is composed of a piezoelectric element layered on those multiple piezoelectric elements.

\* \* \* \* \*